(12) United States Patent
Park

(10) Patent No.: US 12,212,087 B2
(45) Date of Patent: Jan. 28, 2025

(54) TOPSIDE AIR COOLING OF ELECTRONIC PACKAGES

(71) Applicant: Cobham Advanced Electronic Solutions Inc., Lansdale, PA (US)

(72) Inventor: Chul Hong Park, Blue Bell, PA (US)

(73) Assignee: Cobham Advanced Electronic Solutions, Inc., Lansdale, PA (US)

( * ) Notice: Subject to any disclaimer, the term of this patent is extended or adjusted under 35 U.S.C. 154(b) by 411 days.

(21) Appl. No.: 17/390,804

(22) Filed: Jul. 30, 2021

(65) Prior Publication Data

US 2021/0359451 A1    Nov. 18, 2021

(51) Int. Cl.
| | |
|---|---|
| *H01L 23/495* | (2006.01) |
| *H01L 23/00* | (2006.01) |
| *H01L 23/367* | (2006.01) |
| *H01L 23/373* | (2006.01) |
| *H01R 13/03* | (2006.01) |
| *H01R 13/05* | (2006.01) |
| *H01R 13/42* | (2006.01) |

(Continued)

(52) U.S. Cl.
CPC ......... *H01R 13/03* (2013.01); *H01L 23/3677* (2013.01); *H01L 23/3736* (2013.01); *H01L 23/49513* (2013.01); *H01L 23/49568* (2013.01); *H01L 24/17* (2013.01); *H01R 13/055* (2013.01); *H01R 13/42* (2013.01); *H01R 13/646* (2013.01); *H05K 7/20145* (2013.01); *H05K 7/20154* (2013.01); *H01R 12/716* (2013.01); *H01R 13/11* (2013.01); *H01R 2107/00* (2013.01); *H05K 7/20136* (2013.01)

(58) Field of Classification Search
CPC ................. H01L 23/367; H01L 23/473; H01L 23/49568; G06F 1/20
See application file for complete search history.

(56) References Cited

U.S. PATENT DOCUMENTS

| | | | |
|---|---|---|---|
| 7,855,397 B2 * | 12/2010 | Alley | H01L 24/14 |
| | | | 257/E23.101 |
| 8,829,670 B1 * | 9/2014 | Zhang | H01L 21/4871 |
| | | | 257/713 |

(Continued)

OTHER PUBLICATIONS

Tu et al, "An Assessment of Direct Chip Cooling Enhancement Using Pin Fins", Jul. 2012, Heat Transfer Engineering, 33(10): 1-9 (Year: 2012).*

(Continued)

*Primary Examiner* — Stephen S Sul
*Assistant Examiner* — Jeffrey Francis Stoll
(74) *Attorney, Agent, or Firm* — Morgan, Lewis & Bockius LLP

(57) ABSTRACT

The semiconductor chip includes a semiconductor substrate having a surface, a circuit formed on the surface, and a plurality of pillars coupled to the surface adjacent to the circuit. The plurality of pillars is thermally conductive and is thermally coupled to the circuit so as to dissipate heat generated by the circuit. The semiconductor substrate, circuit, and plurality of pillars are integral parts of the integrated semiconductor chip. A method of fabricating the integrated semiconductor chip includes providing a semiconductor substrate having a surface. The method includes forming a circuit on the surface, and forming a plurality of pillars thermally coupled to the surface adjacent to the circuit.

20 Claims, 10 Drawing Sheets

(51) Int. Cl.
  *H01R 13/646*  (2011.01)
  *H05K 7/20*  (2006.01)
  *H01R 12/71*  (2011.01)
  *H01R 13/11*  (2006.01)
  *H01R 107/00*  (2006.01)

(56) References Cited

U.S. PATENT DOCUMENTS

| | | | | |
|---|---|---|---|---|
| 8,941,232 | B2* | 1/2015 | Chou | H01L 23/473 |
| | | | | 257/E23.101 |
| 11,355,418 | B2* | 6/2022 | Yu | H01L 23/3677 |
| 11,464,139 | B2* | 10/2022 | Lofgreen | H05K 7/20254 |
| 2003/0017654 | A1* | 1/2003 | Iwamoto | H01L 23/16 |
| | | | | 257/E21.511 |
| 2008/0067673 | A1* | 3/2008 | Takamatsu | H01L 23/3735 |
| | | | | 257/E23.101 |
| 2012/0228763 | A1* | 9/2012 | Akiyama | H01L 24/05 |
| | | | | 257/737 |
| 2015/0040583 | A1* | 2/2015 | Kwak | H05K 7/20936 |
| | | | | 62/3.2 |
| 2017/0365515 | A1* | 12/2017 | Kuo | H01L 24/02 |
| 2020/0105642 | A1* | 4/2020 | Gandhi | H01L 25/0655 |
| 2020/0144224 | A1* | 5/2020 | Lin | H01L 24/13 |
| 2021/0043557 | A1* | 2/2021 | Lee | H01L 23/481 |
| 2021/0092871 | A1* | 3/2021 | Hur | H05K 7/20163 |
| 2021/0193620 | A1* | 6/2021 | Refai-Ahmed | H01L 23/04 |

OTHER PUBLICATIONS

Radmard et al, "Multi-objective optimization of a chip-attached micro pin fin liquid cooling system", Jun. 7, 2021, Applied Thermal Engineering, 195 (2021) 117187 (Year: 2021).*

Conrad et al, "Purpose, potential and realization of chip-attached micro-pin fin heat sinks", Aug. 17, 2015, Microelectronics Reliability, 55 (2015) 1992-1996 (Year: 2015).*

* cited by examiner

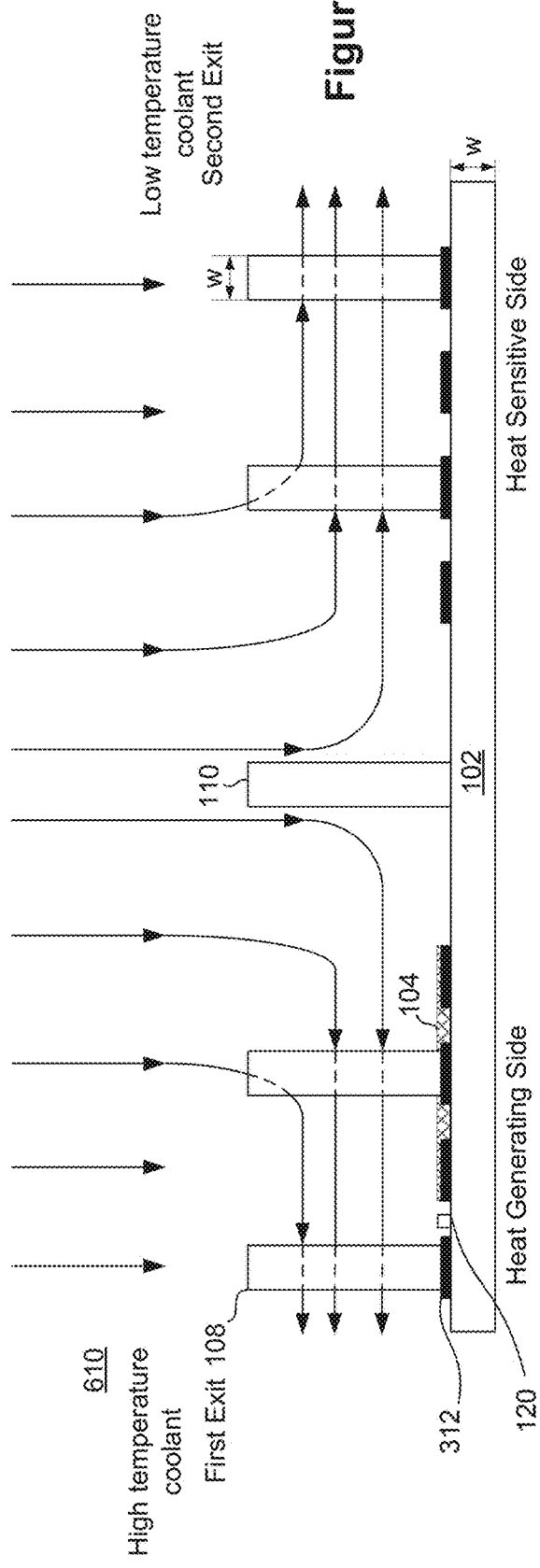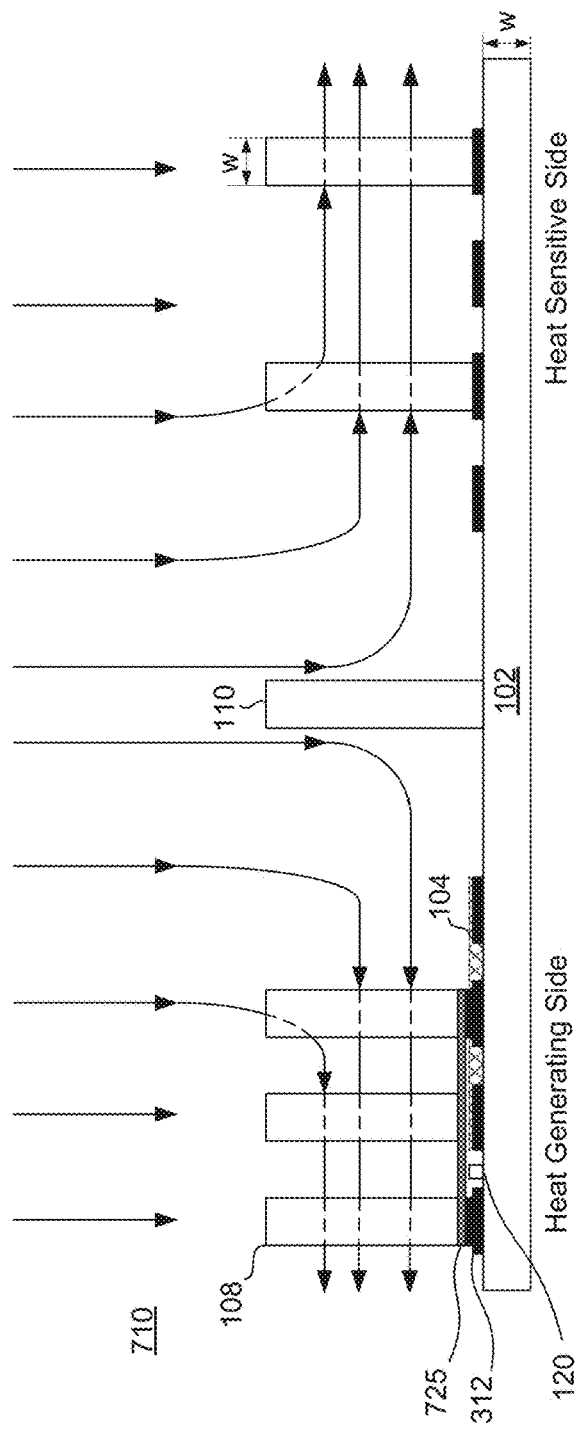

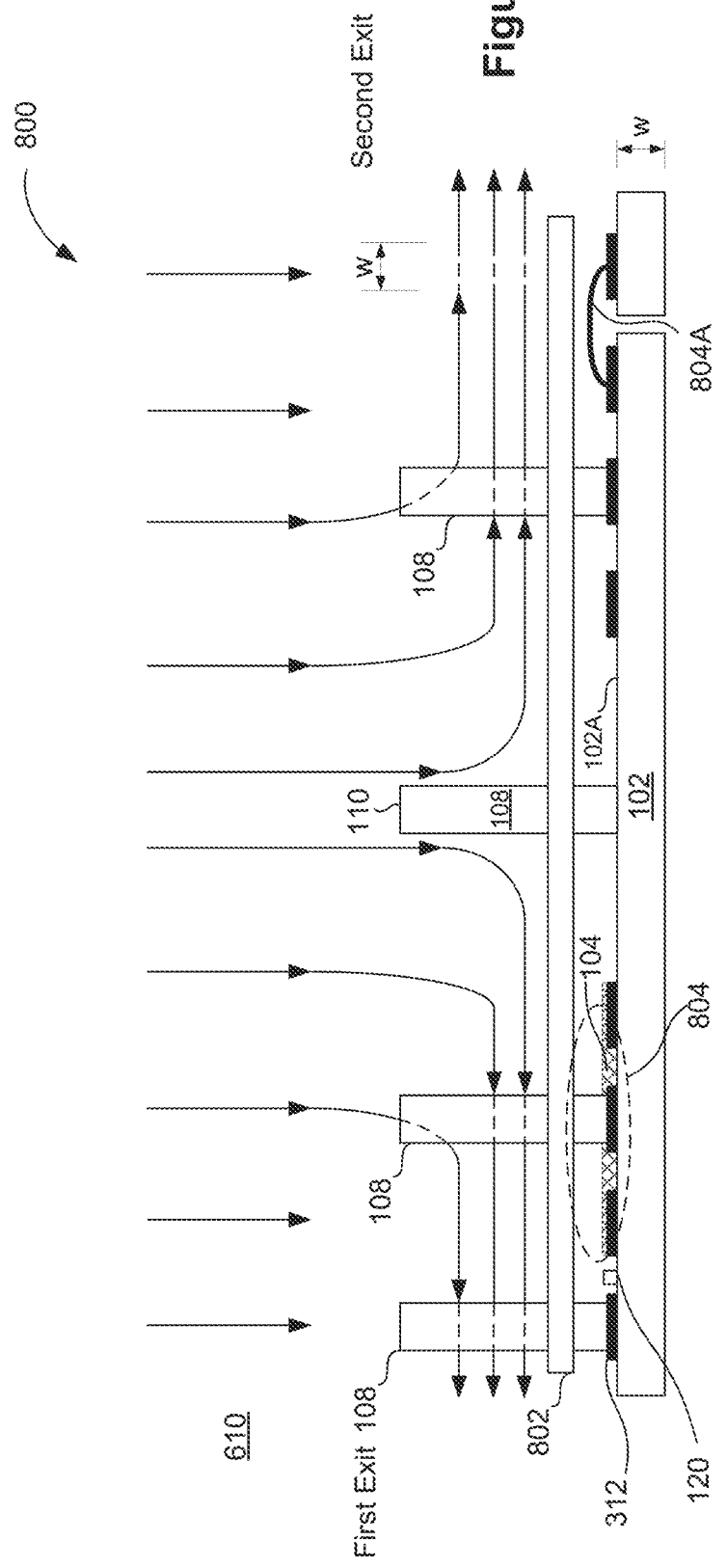

TOPSIDE AIR COOLING OF ELECTRONIC PACKAGES

TECHNICAL FIELD

The disclosed embodiments relate generally to semiconductor packaging technology, and in particular to methods and systems of using heat exchangers to facilitate cooling of an electronic chip or assembly.

BACKGROUND

Performance of high-power electronic components can be limited by amount of cooling provided by their cooling systems. Powerful cooling systems are oftentimes bulky in size, heavy in weight, and cannot satisfy design constraints of many compact electronic systems (e.g., mobile phones). Conversely, many existing cooling systems that comply with the design constraints cannot efficiently and effectively cool electric components in many electronic systems. There is a constant demand for compact cooling solutions that can cooldown electronic components in an electronic system effectively and efficiently.

SUMMARY

Various embodiments of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various embodiments are used to provide a semiconductor system or an integrated semiconductor chip with effective and flexible cooling solutions. These cooling solutions take advantage of and are compatible with existing wafer manufacturing processes. Some embodiments of these cooling solutions are applied jointly with air impingement cooling, which can provide significant savings in weight, size, and cost compared to conventional liquid cooling.

Specifically, one or more fins (also called pillars) are formed on a substrate of a semiconductor chip or package, and a coolant (e.g., air) is used to operate the fins as heat exchangers. The fins are optionally formed as part of a backend wafer process of the semiconductor chip (e.g., similar to a copper pillar) or printed on a semiconductor chip using three-dimensional (3D) metal printing. In some embodiments, the substrate (e.g., of a radio frequency chip) has a plurality of ground pads disposed in proximity to heat generating electronics (e.g., gate fingers). A subset of the fins is optionally formed on the ground pads. The proximity of the fins to the heat generating electronics and the increased surface area of the fins improve heat exchange with these heat generating electronics and provide an effective cooling path to dissipate heat generated thereby. In some embodiments, heat dissipation of this cooling path is further improved as the coolant (e.g., air) having a thermal capacity flows over the surface of the fins. In some embodiments, the cooling path are compatible and used jointly with one or more additional other cooling methods. Alternatively, in some embodiments, additional fins and corresponding supporting structures are used with heat sensitive electronics on the same substrate, acting as a barrier to blocking hot air from impinging on the heat sensitive electronics.

In one aspect, an integrated semiconductor chip includes a semiconductor substrate having a surface, a circuit formed on the surface, and a plurality of pillars coupled to the surface adjacent to the circuit. The plurality of pillars is thermally conductive and is thermally coupled to the circuit so as to dissipate heat generated by the circuit during use. The semiconductor substrate, circuit, and plurality of pillars are integral parts of the integrated semiconductor chip. In some embodiments, the plurality of pillars is made of copper. In some embodiments, each pillar of the plurality of pillars has a respective aspect ratio that is equal to or greater than 10. In some embodiments, the integrated semiconductor chip further includes one or more pillars formed on top of the circuit for dissipating the heat generated by the circuit.

In some embodiments, the integrated semiconductor chip further includes a first plurality of contact pads formed on the surface. Each contact pad of the first plurality of contact pads is disposed between the surface and a respective pillar of the plurality of pillars. Further, in some embodiments, the first plurality of contact pads includes a ground contact pad that is electrically coupled to a ground of the circuit.

In some embodiments, the integrated semiconductor chip further including a second plurality of contact pads formed on the surface and including a ground contact pad electrically coupled to a ground of the circuit. Further, in some embodiments, the integrated semiconductor chip further includes a plurality of electrodes. Each electrode of the plurality of electrodes is electrically conductive and disposed on a respective contact pad of the second plurality of contact pads. The plurality of electrodes has a predefined electrode height and is configured to couple the circuit to an external circuit electrically, the predefined electrode height being greater than a predefined pillar height of the plurality of pillars. Additionally, in some embodiments, the semiconductor substrate includes a first substrate and a second substrate, and the second substrate is flip-chip coupled to the first substrate via the plurality of electrodes. Also, in some embodiments, the second plurality of contact pads further include an input contact pad configured to provide an input signal to the circuit and an output contact pad configured to output an output signal of the circuit.

In some embodiments, the circuit includes a first circuit, and the plurality of pillars includes a first plurality of pillars. The integrated semiconductor chip further includes a second circuit formed on the surface, and a second plurality of pillars coupled to the surface adjacent to the second circuit. The second plurality of pillars are thermally conductive and thermally coupled to the second circuit so as to at least partially absorb and dissipate the heat generated by the first circuit and protect the second circuit from the heat generated by the first circuit during use. Further, in some embodiments, the second plurality of pillars includes a pillar wall that has a length greater than a width, and the pillar wall is disposed between the first and second circuits and configured to at least partially block air flow that carries the heat generated by the first circuit.

In some embodiments, the surface includes a first surface, and the plurality of pillars includes a first plurality of pillars. The integrated semiconductor chip further includes a third plurality of pillars formed on a second surface of the semiconductor substrate, and the second surface is opposite the first surface.

In another aspect, a method includes providing a semiconductor substrate having a surface, forming a circuit on the surface, and forming a plurality of pillars coupled to the surface adjacent to the circuit. The plurality of pillars is thermally conductive and is thermally coupled to the circuit so as to dissipate heat generated by the circuit during use. The semiconductor substrate, circuit, and plurality of pillars are integral parts of the integrated semiconductor chip. In some embodiments, each pillar of the plurality of pillars has a respective aspect ratio that is equal to or greater than 10. In some embodiments, forming the plurality of pillars coupled to the surface further includes electroplating copper on the surface to form the plurality of pillars. In some embodiments, the plurality of pillars are printed on the surface of the semiconductor chip using three-dimensional (3D) metal printing.

In some embodiments, the method further including forming a first plurality of contact pads on the surface. Each contact pad of the first plurality of contact pads is disposed between the surface and a respective pillar of the plurality of pillars. Further, in some embodiments, the first plurality of contact pads includes a ground contact pad that is electrically coupled to a ground of the circuit.

In some embodiments, the method further includes forming a second plurality of contact pads on the surface. The second plurality of contact pads includes a ground contact pad electrically coupled to at least a ground of the circuit. Further, in some embodiments, the method further includes forming a plurality of electrodes. Each electrode of the plurality of electrode is electrically conductive and disposed on a respective contact pad of the second plurality of contact pads. The plurality of electrodes has a predefined electrode height and is configured to couple the circuit to an external circuit electrically, the predefined electrode height being greater than a predefined pillar height of the plurality of pillars. Additionally, in some embodiments, the semiconductor substrate includes a first substrate, and the method further includes providing a second substrate that is a flip-chip coupled to the first substrate via the plurality of electrodes. Further, in some embodiments, the second plurality of contact pads further includes an input contact pad configured to provide an input signal to the circuit and an output contact pad configured to output an output signal.

In yet another aspect, a semiconductor system includes a semiconductor substrate having a surface, a circuit disposed on the surface, and a plurality of pillars coupled to the surface adjacent to the circuit. The plurality of pillars is thermally conductive and is thermally coupled to the circuit so as to dissipate heat generated by the circuit during use. The semiconductor substrate, circuit, and plurality of pillars are integral parts of the semiconductor system. In some embodiments, the semiconductor substrate includes a dielectric board (e.g., a printed circuit board (PCB), ceramic board, diamond board) with a metal pattern.

Note that the various embodiments described above can be combined with any other embodiments described herein. The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

FIGS. 8A and 8B illustrate impingement cooling of the semiconductor chips shown in FIGS. 6A-6B and 7A-7B, in accordance with some embodiments.

FIG. 8C is a cross sectional view of another semiconductor chip, in accordance with some embodiments.

Figure 1A:
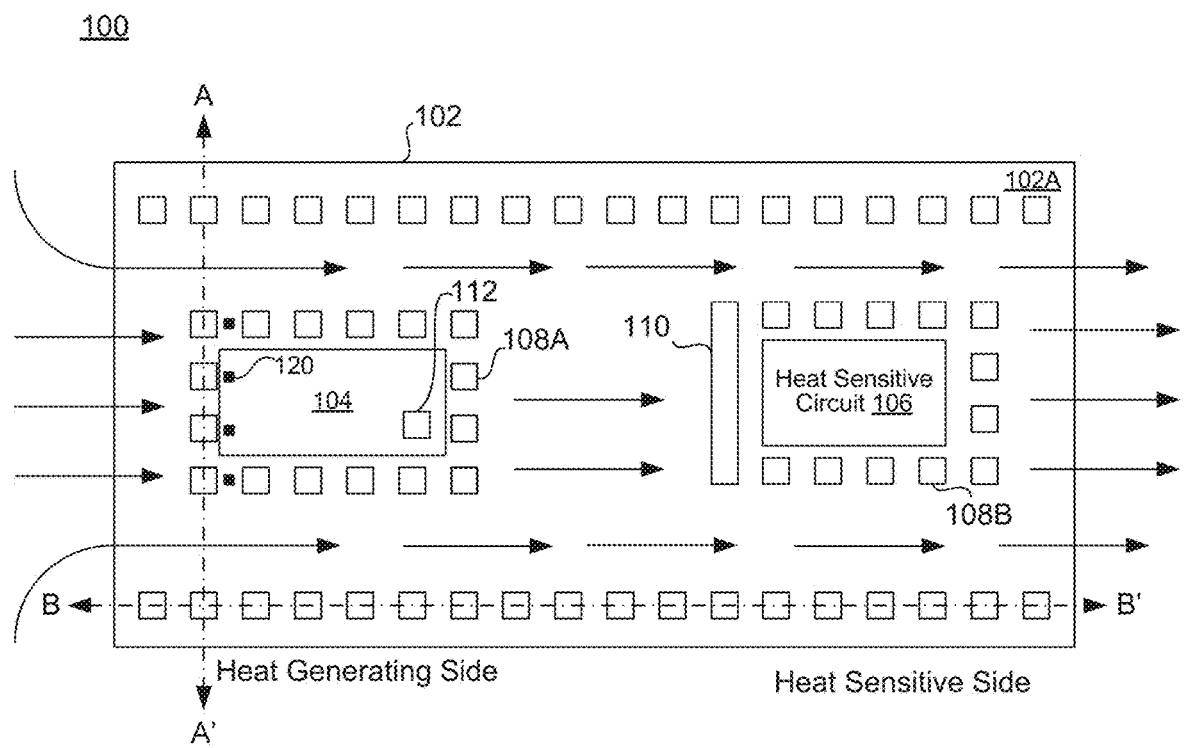
FIGS. 1A and 1B are top views of integrated semiconductor chips having pillars, in accordance with some embodiments.

In accordance with common practice, the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known processes, components, and materials have not been described in exhaustive detail so as not to unnecessarily obscure pertinent aspects of the embodiments described herein.

Figure 1B:
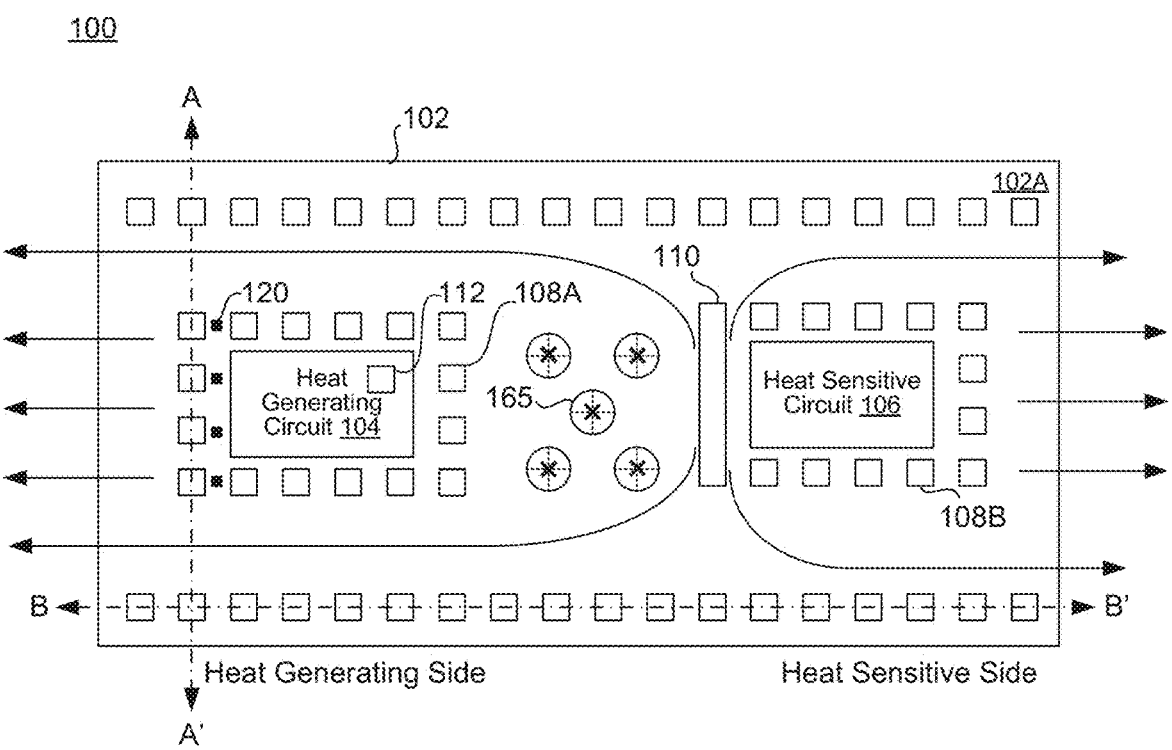

FIGS. 1A and 1B are top views of an integrated semiconductor chip 100 having pillars, in accordance with some embodiments. The semiconductor chip 100 includes a semiconductor substrate 102, one or more circuits (e.g., a heat generating circuit 104, a heat sensitive circuit 106), and a plurality of pillars 108 (also called fins). The semiconductor substrate 102, the one or more circuits, and pillars 108 are integral parts of the integrated semiconductor chip 100. The semiconductor substrate 102 includes one or more surfaces, e.g., a first surface 102A and a second surface 102B that is opposite the first surface 102A and not shown in FIGS. 1A and 1B. In some embodiments, a plurality of contact pads (e.g., pads 202 in FIGS. 2A-5B) is formed on the semiconductor surface 102. One or more contact pads of the plurality of contact pads are disposed between the semiconductor surface 102 and a subset of the plurality of pillars 108.

The one or more circuits are monolithically formed on the first surface 102A of the substrate 102 or mounted in a hybrid manner on the first surface of the substrate 102. In some embodiments, the one or more circuits include the heat generating circuit 104 that generates at least a portion of heat of the semiconductor chip 100, and the heat generated by the heat generating circuit 104 needs to be dissipated away from the substrate 102 or a semiconductor package in which the substrate 102 is contained. In some embodiments, the one or more circuits further include the heat sensitive circuit 106 that is sensitive to heat and could be exposed to heat generated by the heat generating circuit 104 on the same substrate 102 or other components external to the semiconductor chip 100. In some embodiments, a liquid or gaseous impingement coolant 114 is injected onto the first or second surface of the substrate 102 (e.g., in FIG. 1B) or in parallel with the first or second surface of the substrate 102 (e.g., in FIG. 1A), and configured to carry away the heat generated by the semiconductor chip 100 from the first surface 102A or second surface 102B of the substrate 102.

In some embodiments, the plurality of pillars 108 is coupled to a portion of the first surface 102A adjacent to the heat generating circuit 104. The plurality of pillars 108 is thermally conductive and is thermally coupled to the circuit so as to dissipate the heat generated by the semiconductor chip 100 during use, e.g., heat generated by the heat generating circuit 104. In an example, a subset of the plurality of pillars 108 surrounds a heat area of the heat generating circuit 104, e.g., transistors 120 that generate heat in the circuit 104, thereby providing an effective cooling path for the heat area of the heat generating circuit 104. In some embodiments, the subset of the plurality of pillars 108 are substantially adjacent to the transistors 120A (e.g., no more than a few microns (e.g., less than 10 microns)). In some embodiments, a subset of the plurality of pillars 108 is disposed on top of a plurality of contact pads that is disposed adjacent to the heat generating circuit 104. In some embodiments, the subset of the plurality of pillars 108 are formed on top of the plurality of contact pads by electroplating copper on the plurality of contact pads. Alternatively, in some embodiments, the plurality of pillars 108 are attached on top of the plurality of contact pads using processes known in the art, such as soldering, wire bonding, (thermal) adhesives, annealing, etc. Alternatively, in some embodiments, the plurality of pillars 108 are printed on the surface 102A of the semiconductor chip 102 using three-dimensional (3D) metal printing.

In some embodiments, the plurality of contact pads includes one or more ground pads, and one of the plurality of pillars 108 is formed on a ground pad. In an example, one of the plurality of pillars 108 is formed on top of a ground pad located adjacent to the heat area (e.g., including a transistor 120) that generates a substantial portion (e.g., >20%) of the heat generated by the heating generating circuit 104. More specifically, the plurality of pillars 108 facilitate dissipation of the heat generated by the semiconductor chip 100 by increasing a surface area of the semiconductor chip 100, particularly near the portion of the first surface 102A adjacent to the heat generating circuit 104.

In some embodiments, one or more additional pillars 112 are coupled on the heat generating circuit 104. Each of the one or more additional pillars 112 has a respective footprint shape, a respective footprint size, and a respective height. The respective footprint shape, footprint size, and height are the same as or distinct from those of other pillars 108 or 112. In some embodiments, the semiconductor chip 100 further includes a third plurality of pillars 302 (shown in FIGS. 3A and 3B) that is coupled on a portion of the second surface 102B adjacent to or overlapping the heat generating circuit 104. By these means, the pillars 108 and 112 and/or the third plurality of pillars 302 are configured to dissipate heat generated by the heat generating circuit 104 jointly, i.e., by increasing a surface area a portion of the substrate adjacent to or overlapping the heat generating circuit 104.

In some embodiments, the plurality of pillars 108 include a plurality of fins. In some embodiments, the fins have different shapes and/or sizes. Each fin has a respective footprint shape and a respective footprint size on the first surface 102A of the substrate 102. Each fin has a respective height measured from the first surface 102A to a tip of the respective fin. The respective footprint shape of each fin is one of a square, a rectangular, a circle, a ring, a triangle, a solid or hollow polygon, and any regular or irregular shapes. Optionally, the plurality of fins have a constant footprint area, footprint shape and height. Optionally, the plurality of fins have different footprint areas, footprint shapes and/or heights. In some embodiments, the plurality of fins are micro fins manufactured by a microfabrication technique, e.g., electroplating. Alternatively, in some embodiments, the plurality of fins are printed on the first surface 102A of the semiconductor chip 102 using 3D metal printing.

In some embodiments, the footprint size and the height of each pillar or fin are represented by a predefined width and a predefined height, respectively. In a specific example, the predefined height is a few hundred microns (e.g., 100 microns, 200 microns, 300 microns, etc.). In some embodiments, the predefined width is the same as the thickness of the substrate 102 (as shown in FIGS. 6A-8A). The predefined width and the thickness of the of the substrate 102 is approximately 100 microns (e.g., +/−10 microns). In some situations, the predefined height is not limited to a few hundred microns or by the thickness of the substrate 102.

In some embodiments, the predefined width is based on the predefined height, such that each pillar has a respective aspect ratio between the predefined height and width. In an example, the aspect ratio of at least one pillar is equal to or greater than 10. In some embodiments, an aspect ratio equal to or greater than 10 is preferred as it provides high heat transfer, is easily manufactured, and provides greater reliability and stability. Further, pillars (or fins) with an aspect ratio equal to or greater than 10 have a smaller footprint, are light weight, and satisfy design constraints of many compact electronic systems that are not satisfied by conventional cooling systems. In some embodiments, each pillar of the plurality of pillars 108 has the same aspect ratio. Alternatively, in some embodiments, one or more pillars of the plurality of pillars 108 have distinct aspect ratios.

As explained above, each pillar of the plurality of pillars 108 is the same. Alternatively, in some embodiments, one or more pillars of the plurality of pillars 108 are distinct (e.g., different heights, different shapes, etc.) in some embodiments. In some embodiments, the plurality of pillars 108 is made of copper. In some embodiments, the plurality of pillars 108 is formed by electroplating copper on the first surface 102A and/or second surface 102B of the semiconductor substrate 102. Alternatively, in some embodiments, the plurality of pillars 108 are printed on the surface 102A of the semiconductor chip 102 using 3D metal printing.

In some embodiments, one or more regions of the semiconductor chip 100 are sensitive to a high speed or high temperature coolant, and the plurality of pillars 108 is configured to reduce an impact of the high speed or high temperature coolant on the one or more sensitive regions. For example, the heat generating circuit 104 is sensitive to a high speed coolant. In another example, the heat sensitive circuit 106 is sensitive to high temperature, such as high temperature fluid (e.g., air) flowing from the heat generating circuit 104 or other portions of the semiconductor chip 100. When the high speed or high temperature coolant passes the one or more sensitive regions, the plurality of pillars 108 disposed nearby disturb the coolant and reduce the mechanical or thermal impact on the sensitive regions. For example, the plurality of pillars 108 protects the one or more sensitive regions of the semiconductor chip 100 by redirecting the coolant away from the one or more sensitive regions.

Specifically, in some embodiments, the semiconductor chip further includes a second plurality of pillars 108B (distinct from a first plurality of pillars 108A) that are coupled to a portion of the first surface 102A adjacent to the heat sensitive circuit 106. The second plurality of pillars 108B is thermally conductive and thermally coupled to the second circuit so as to at least partially absorb and dissipate the heat generated by the heat generating circuit 104 and protect the heat sensitive circuit 106 from the heat generated by the heat generating circuit 104. In some embodiments, the second plurality of pillars 108B has a height greater than the respective height of the first plurality pillars 108A for the purposes of protecting the heat sensitive circuit 106. In some embodiments, the second plurality of pillars 108B has a footprint size greater than the respective footprint size of the first plurality pillars 108A. For example, the second plurality of pillars 108B can include a pillar wall 110 that has a length greater than a width. The pillar wall 110 is disposed between the heat generating circuit 104 and heat sensitive circuit 106, and configured to at least partially block the coolant (e.g., air flow) carrying the heat generated by the heat generating circuit 104 and reduce its thermal impact on the heat sensitive circuit 106. In some embodiments, the pillar wall 110 includes a predetermined shape that is configured to redirect the coolant. For example, the pillar wall 110 can be "V" shaped, concave shaped, convex shaped, etc. such that the coolant is redirected without passing one or more components (e.g., the heat sensitive circuit 106).

The semiconductor substrate 102 is configured such that coolant flows across one or more of its surfaces. In some embodiments, the coolant enters from a first end (e.g., B) of the semiconductor substrate 102 and exits from a second end (e.g., B'). The coolant flows over the one or more circuits and the plurality of pillars 108. In some embodiments, the coolant is provided through an impingement cooling process in which the coolant is optionally injected at a high speed. In some embodiments, the coolant is air, water, refrigerants, or other fluids and/or gasses. The coolant flows over the plurality of pillars 108 such that the plurality of pillars 108 operate as a heat exchanger and cool the one or more circuits of the semiconductor chip 100. More specifically, the coolant flowing across the one or more surfaces of the semiconductor substrate 102 improves heat transfer with at least the heat generating circuit 104 via the plurality of pillars 108. Such heat transfer is based, in part, on (1) the footprint shapes (e.g., square, circular, cross), footprint sizes (e.g., length, width, area), and heights of the pillars, (2) a flow rate, type, base temperature of the coolant, and/or (3) other factors known in the art.

As further shown in FIG. 1A, the pillar wall 110 is configured to protect the heat sensitive side of the semiconductor substrate 102 by redirecting high temperature coolant. More specifically, the pillar wall 110 prevents (or reduces the amount of) coolant with high temperatures (i.e., coolant that transfer heat from the heat generating circuit 104 and/or the transistors 120) from travelling over the heat sensitive circuit 106 or heat sensitive side of the semiconductor substrate 102—redirecting the high temperature coolant to the outer edges (e.g., A and A') of the semiconductor substrate 102 before the coolant exits from the second end (e.g., B').

In FIG. 1B, the semiconductor chip 150 is configured such that coolant impinges directly on the semiconductor substrate 102 (e.g., a coolant flow is injected onto the semiconductor substrate 102 represented by arrows 165). In some embodiments, the coolant impinges on the semiconductor substrate 102 and exits from the first end (e.g., B) of the semiconductor substrate 102 and also exits from the second end (e.g., B'). The coolant flows over the one or more circuits and the plurality of pillars 108. As mentioned above, the coolant is optionally injected at a high speed. The coolant flows over the plurality of pillars 108 such that the plurality of pillars 108 operate as a heat exchanger and cool the one or more circuits of the semiconductor chip 100. More specifically, the coolant flowing across the one or more surfaces of the semiconductor substrate 102 improves heat transfer with at least the heat generating circuit 104 via the plurality of pillars 108. Such heat transfer is based, in part, on (1) the footprint shapes (e.g., square, circular, cross), footprint sizes (e.g., length, width, area), and heights of the pillars, (2) a flow rate, type, base temperature of the coolant, and/or (3) other factors known in the art.

As further shown in FIG. 1B, the pillar wall 110 is configured to protect the heat sensitive side of the semiconductor substrate 102 by redirecting high temperature coolant. More specifically, the pillar wall 110 prevents (or reduces the amount of) coolant with high temperatures (i.e., coolant that transfer heat from the heat generating circuit 104) from travelling along the heat sensitive side of the semiconductor substrate 102—only allowing the high temperature coolant to exit from the first end (e.g., B) of the semiconductor substrate 102. While the pillar wall 110 prevents (or reduces the amount of) coolant with high temperatures from travel along the heat sensitive side of the semiconductor substrate 102, the pillar wall 110 still allows for cold or low heat coolant to travel along the heat sensitive side of the semiconductor substrate 102 (and exit from the second end (e.g., B') of the semiconductor substrate 102). More details on the redirected coolant are provided below in reference to FIGS. 8A and 8B.

Referring to FIGS. 1A and 1B, in some embodiments, a semiconductor system is implemented similarly like the integrated semiconductor chip 100. In the semiconductor system, the semiconductor substrate 102 is a printed circuit board (PCB) on which the plurality of pillars 108 is formed (e.g., electroplated, printed), while the heat generating circuit 104 and/or heat sensitive circuit 106 are assembled onto the semiconductor substrate 102 in a hybrid manner. From a broader perspective, in some embodiments, the semiconductor substrate includes a dielectric board (e.g., the PCB, ceramic board, diamond board) with a metal pattern.

Figure 2A:
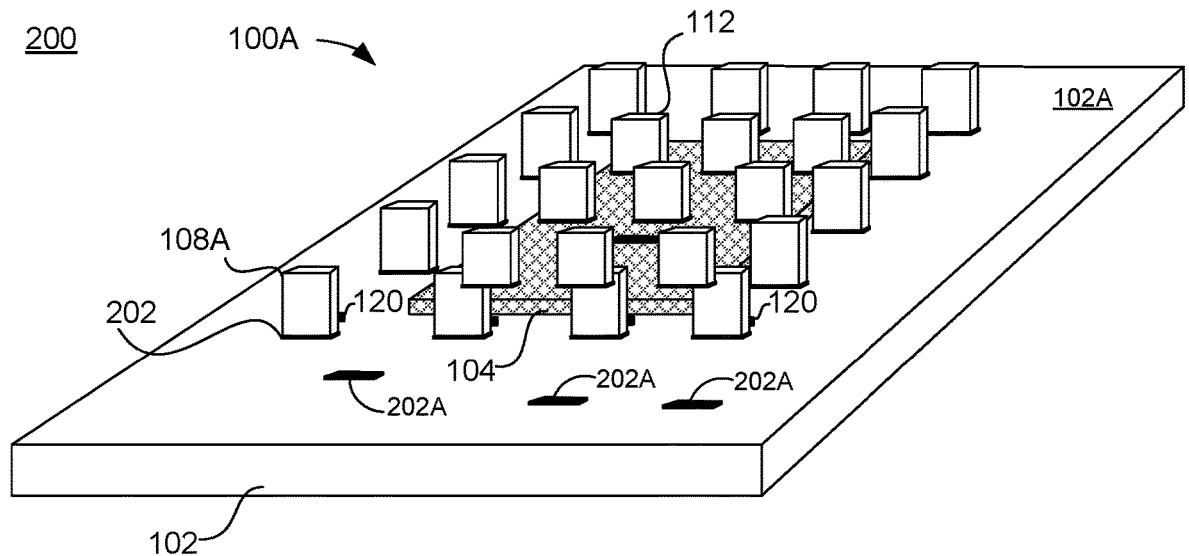
FIGS. 2A and 2B are top perspective views of two regions of the integrated semiconductor chip shown in FIGS. 1A and 1B, in accordance with some embodiments.
Figure 2B:
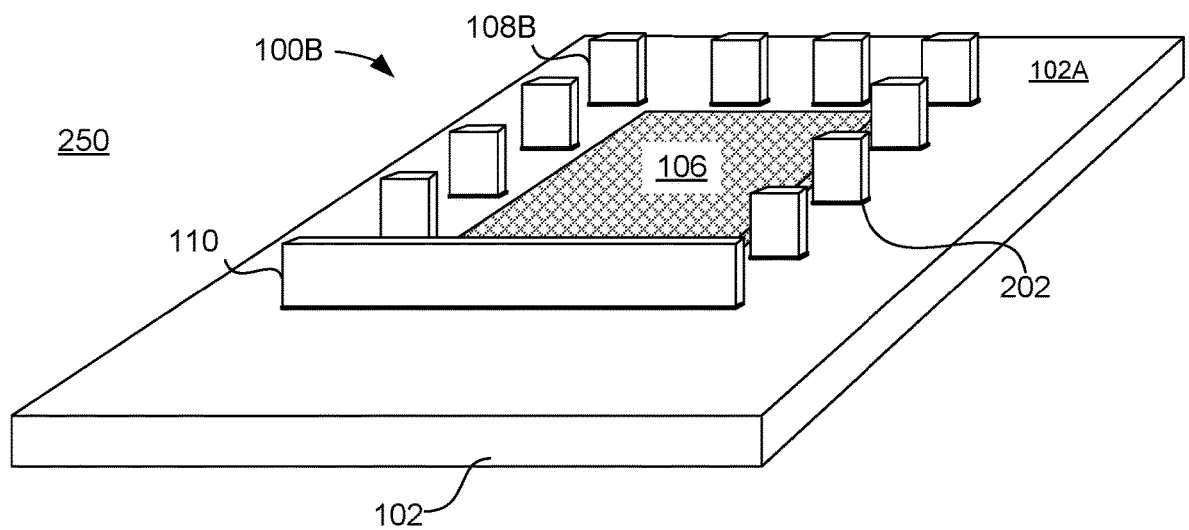

FIGS. 2A and 2B are top perspective views of two regions 200 and 250 of the integrated semiconductor chip 100 shown in FIGS. 1A and 1B, in accordance with some embodiments. A first region 200 of the semiconductor chip 100 includes a semiconductor substrate 102, a heat generating circuit 104, a first plurality of pillars 108A, a plurality of additional pillars 112, and a first subset of a plurality of contact pads 202. A second region 250 of the semiconductor chip 100 includes the semiconductor substrate 102, a heat sensitive circuit 106, a second plurality of pillars 108B (including a pillar wall 110), and a second subset of the contact pads 202.

Referring to FIG. 2A, in some embodiments, the plurality of contact pads 202 is formed on a first surface 102A of the semiconductor substrate 102. One or more contact pads of the plurality of contact pads 202 are disposed between the surface 102A of the semiconductor substrate 102 and a pillar of the first plurality of pillars 108A. In some embodiments, the plurality of contact pads 202 is adjacent to a heat source of the semiconductor chip 100 (e.g., transistors 120 in the heat generating circuit 104), such that the first plurality of pillars 108A, when coupled to the plurality of contact pads 202, absorbs heat generated by the semiconductor chip 100 via the contact pads 202. In some embodiments, the plurality of contact pads 202 includes one or more ground contact pads (e.g., pads 312 in FIG. 3) that are electrically coupled to a ground of the semiconductor chip 100. In some embodiments, the semiconductor chip 100 has a plurality of ground accesses electrically coupled to the ground, and the one or more ground contact pads 312 are coupled to the same or distinct ground accesses.

In some embodiments, the plurality of contact pads 202 includes one or more input contact pads (e.g., input/output contact pad 502 FIG. 5). The input contact pads are configured to receive input signals from one or more circuits of the semiconductor chip 100, external semiconductor systems, user input devices, and/or other components external to the semiconductor chip 100. The input contact pads are configured to provide the input signals to the heat generating circuit 104 of the semiconductor chip 100. In some embodiments, a pillar 108 is formed on top of one of the input contact pads without impacting its electrical function of providing the input signals to the heat generating circuit 104. In some embodiments, the plurality of contact pads 202 includes one or more output contact pads (e.g., input/output contact pad 502 FIG. 5). The output contact pads are configured to output output signals of the heat generating circuit 104 and provide the output signals to other internal circuits, external semiconductor systems, user input devices, and/or other components external to the semiconductor chip 100. In some embodiments, a pillar 108 is formed on top of one of the output contact pads without impacting its electrical function of providing the output signals of the heat generating circuit 104. Further, in some embodiments, one or more contact pads 202A are disposed on the first surface 102A of the substrate 102, and no pillar 108 is formed on these contact pads 202A. These free contact pads 202A can be used to test the substrate 102 and/or one or more circuits coupled to the substrate 102 in a non-destructive manner. The contact pads 202A can also be used to add new circuits to the substrate 102, add new pillars 108, and/or make any number of other electrical connections or improvements to the substrate 102.

In some embodiments, the plurality of additional pillars 112 is formed directly on the heat generating circuit 104 of the semiconductor chip 100, and configured to dissipate heat generated by the heat generating circuit 104. In some embodiments, the first plurality of pillars 108A and the plurality of additional pillars 112 have the same height, i.e., extend above the surface 102A of the semiconductor chip 100 by the same height. For example, top ends of the pillars 108 and 112 can both be 250 microns above the surface 102A of the semiconductor substrate 102 surface. Alternatively, in some embodiments, the first plurality of pillars 108A extends above the surface of the semiconductor chip 100 by a first height, and the plurality of additional pillars 112 extends above the surface of the semiconductor chip 100 by a second height. In some embodiments, the second height is less than the first height. In other embodiments, the second height is greater than the first height.

Referring to FIG. 2B, in some embodiments, the second plurality of pillars 108B is coupled adjacent to the heat sensitive circuit 106, and configured to protect the heat sensitive circuit 106 from a high speed and/or high temperature coolant. In some embodiments, the second plurality of pillars 108B includes a pillar wall 110 that has a length greater than its width. Optionally, the pillar wall 110 maintains an aspect ratio that is equal to or greater than 10, i.e., a ratio between a height and a width of the pillar wall 110 is equal to or greater than 10. For example, a pillar wall 110 has a height of 200 microns, a width 10 microns, and a length of 50 microns. In some embodiments, the pillar wall 110 is disposed between the heat generating circuit 104 and the heat sensitive circuit 106, and configured to at least partially block a coolant flow that carries the heat generated by the heat generating circuit 104.

In some embodiments, the second subset of the contact pads 202 is disposed between the first surface 102A of the semiconductor substrate 102 and the second plurality of pillars 108B including the pillar wall 110. Each of the second subset of the contact pads 202 is optionally an input pad for receiving an input signal, an output pad for outputting an output signal, a ground pad electrically coupled to the ground of the semiconductor chip 100, or a dummy pad that is not electrically coupled to any circuit.

Referring to FIGS. 2A and 2B, in some embodiments, each of the plurality of contact pads 202, if disposed under a respective pillar 108, 110 or 112, has the same dimension (e.g., width and length) as the respective pillar. For example, a contact pad of the plurality of contact pads 202 has the same length and width as the pillar wall 110. In some embodiments, each of the plurality of contact pads 202, if disposed under a respective pillar 108, 110 or 112, has a different dimension (e.g., width and length) from the respective pillar. For example, two or more contact pads 202 are disposed between the respective pillar 108, 110 or 112 and the first surface 102A of the semiconductor substrate 102. Each contact pad 202 is smaller than the respective pillar 110. In FIG. 2B, two or more contact pads are disposed between the pillar wall 110A and the surface of the semiconductor substrate 102.

Figure 3A:
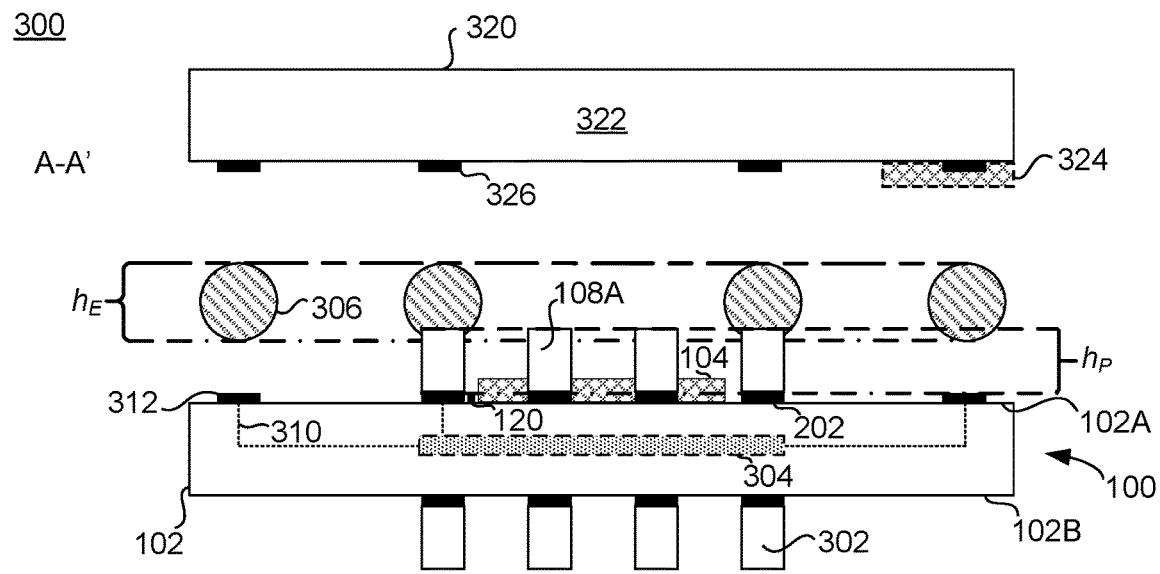
FIGS. 3A and 3B are exploded and cross-sectional views of a flip-chip semiconductor system, in accordance with some embodiments, respectively.
Figure 3B:
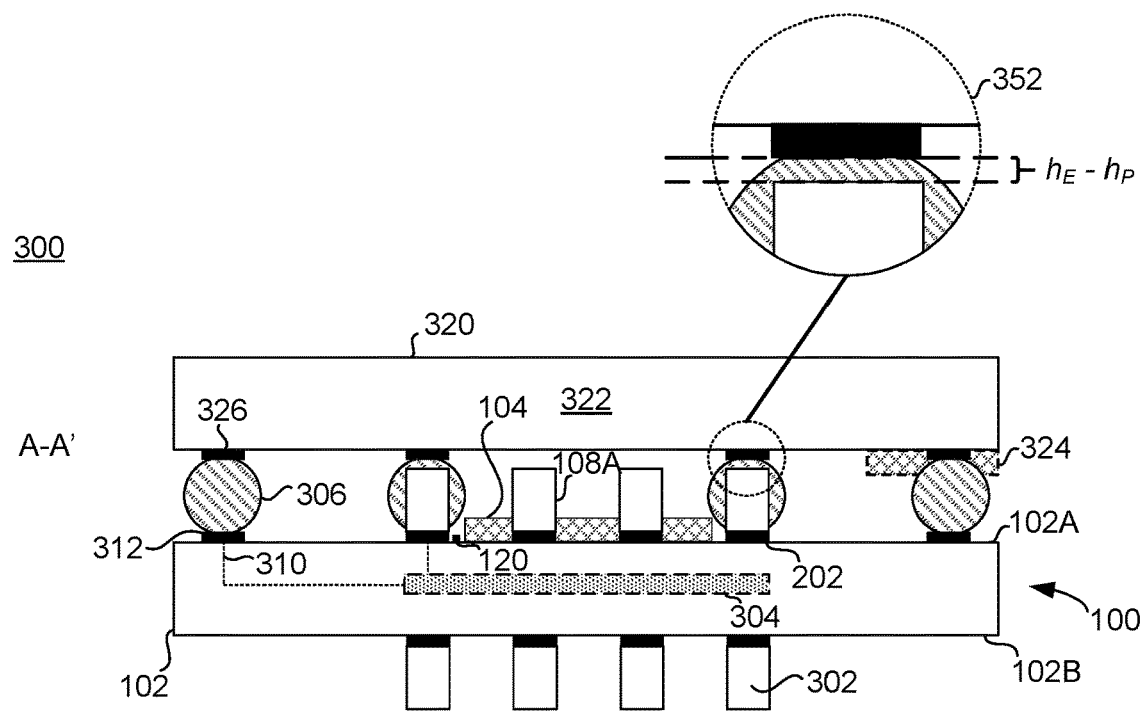

FIGS. 3A and 3B are exploded and cross-sectional views of a flip-chip semiconductor system 300, in accordance with some embodiments, respectively. The flip-chip semiconductor system 300 includes a semiconductor chip 100 and another substrate 322 that is coupled onto the semiconductor chip 100. Specifically, the semiconductor system 300 includes a semiconductor substrate 102, a heat generating circuit 104, a first plurality of pillars 108A, a plurality of contact pads 202, a third plurality of pillars 302, a ground 304, a plurality of electrodes 306, and an external semiconductor device 320. In some embodiments, the external semiconductor device 320 includes another substrate 322, one or more additional circuits 324, and another plurality of contact pads 326. Both of the exploded and cross-sectional views in FIGS. 3A and 3B correspond to an instance of the flip-chip semiconductor system 300 that is cut along a line A-A' of the semiconductor chip 100 in FIGS. 1A and 1B.

The semiconductor substrate 102 includes a first surface 102A and a second surface 102B opposite the first surface 102A. One or more circuits (e.g., the heat generating circuit 104) are formed on one of the surfaces of the semiconductor substrate 102 (e.g., the first surface 102A or the second surface 102B). In some embodiments, the semiconductor substrate 102 includes a plurality of contact pads 202 formed on one or both of its surfaces. In some embodiments, a subset of the plurality of contact pads 202 is coupled between the first surface 102A and the first plurality of pillars 108A. Additionally or alternatively, in some embodiments, a subset of the plurality of contact pads 202 is coupled between the second surface 102B and the third plurality of pillars 302. In some embodiments, the third plurality of pillars 302 and the first plurality of pillars 108A occupy the same footprint on their respective surfaces. Alternatively, in some embodiments, the third plurality of pillars 302 is disposed on the second surface 102B, independently of how the first plurality of pillars 108A is disposed on the first surface 102A, and configured to dissipate heat generated by the heat generating circuit 104 jointly with the first plurality of pillars 108A from both surfaces 102A and 102B. More details on the first plurality of pillars 108A is discussed above with reference to FIGS. 1 and 2A-2B.

In some embodiments, the semiconductor substrate 102 includes one or more grounds 304, such as a ground plane. The ground 304 is electrically coupled to one or more components of the semiconductor chip 100. In some embodiments, the ground 304 includes a plurality of ground vias 310 that electrically couple one or more components of the semiconductor chip 100 to the ground 304. For example, one or more ground vias 310 are electrically coupled to one or more contact pads of the plurality of contact pads 202, one or more circuits (e.g., the heat generating circuit 104), and/or other components of the semiconductor chip 100. One or more contact pads 202, one or more circuits, and/or other components of the semiconductor chip 100 are optionally coupled to the same ground 304 and/or distinct grounds 304 by way of different ground vias 310. In some embodiments, a contact pad 202 coupled to a ground via 310 is referred to a ground pad 312. In some embodiments, one or more ground pads 312 are adjacent to one or more heat sources in the semiconductor chip 100 (e.g., transistor 120), and one or more pillars 108 are formed on the one or more ground pads 312 to dissipate heat from the semiconductor chip 100.

The plurality of electrodes 306 is electrical interconnects disposed between the semiconductor chip 100 and the external semiconductor device 320. In some embodiments, the plurality of electrodes 306 includes one or more of a ball grid array (BGA), elastomer pins, spring pins, and other electrical interconnects known in the art. The plurality of electrodes 306 is electrically conductive and configured to electrically couple the semiconductor chip 100 and the external semiconductor device 320. In some embodiments, the plurality of electrodes 306 is disposed between one or more contact pads 202 of the semiconductor chip 100 and one or more contact pads 326 of the other semiconductor device 320. The plurality of electrodes 306 is configured to couple one or more circuits (e.g., the heat generating circuit 104, the heat sensitive circuit 106, and/or other circuits) of the semiconductor chip 100 and one or more circuits (e.g., additional circuits 324) of the external semiconductor device 320. In some embodiments, the external semiconductor device 320 is coupled to the semiconductor chip 100 in a flip chip assembly via the electrodes 306, and vice versa.

The plurality of electrodes 306 has a predefined electrode height (shown by $h_E$). The predefined electrode height $h_E$ is greater than any the predefined heights of the pillars 108, 110 and 112 (collectively shown by $h_P$). Note that pillars 110 or 112 are not shown in FIGS. 3A and 3B (additional details on the pillars 110 and 112 are provided above with reference to FIGS. 1A-2B). The predefined electrode height $h_E$ of the plurality of electrodes 306 is designed such that the pillars 108, 110 and 112 do not contact a surface of the external semiconductor device 320 when the semiconductor chip 100 is coupled to the semiconductor device 320. This allows the pillars 108, 110 and 112 to maintain a free end (e.g., a first end of a pillar coupled to the semiconductor substrate 102, and a second end of a pillar (opposite the first end) uncoupled and in free space). By these means, the pillars 108, 110 and 112 do not contact the external semiconductor device 320, nor can the pillars 108, 110 and 112 be shorted to one or more circuits 324 or contact pads 326 of the external semiconductor device 320.

Referring to FIG. 3B, a magnified view 352 illustrates a height difference $h_E$-$h_P$ between the plurality of electrodes 306 and the pillars 108. The first plurality of pillars 108A does not reach one or more contact pads of the other plurality of contact pads 326. The first plurality of pillars 108A is separated from the other plurality of contact pads 326 by a distance equal to the difference between the predefined electrode height $h_E$ of the plurality of electrodes 306 and the predefined height $h_P$ of the first plurality of pillars 108A. The predefined electrode height $h_E$ of the plurality of electrodes 306 is determined based, in part, on one or more of the type of electrode (e.g., elastomer pin, BGA, etc.). Once the electrodes 306 are selected, the height $h_P$ of each of the pillars 108, 110 and 112 is determined based on the predefined electrode height $h_E$ and a desired separation between the pillars 108, 110 and 112 and the contact pads 326, and other factors. For example, in some embodiments, the height $h_E$ of the plurality of electrodes 306 is greater than 100 microns (e.g., 110 microns, 130 microns, 150 microns, etc.), and each pillar 108, 110 or 112 can be formed up to at least 100 microns without touching the contact pads 326 in the semiconductor system 300 that couples the semiconductor chip 100 to the semiconductor device 320.

Figure 4A:
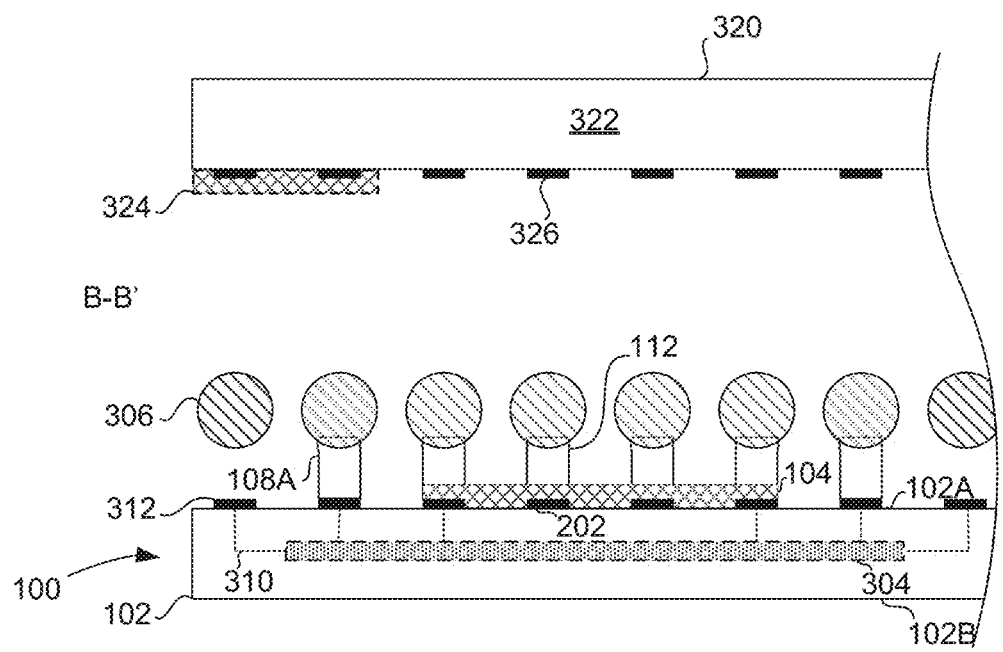
FIGS. 4A and 4B are exploded and cross-sectional views of another flip-chip semiconductor system, in accordance with some embodiments.
Figure 4B:
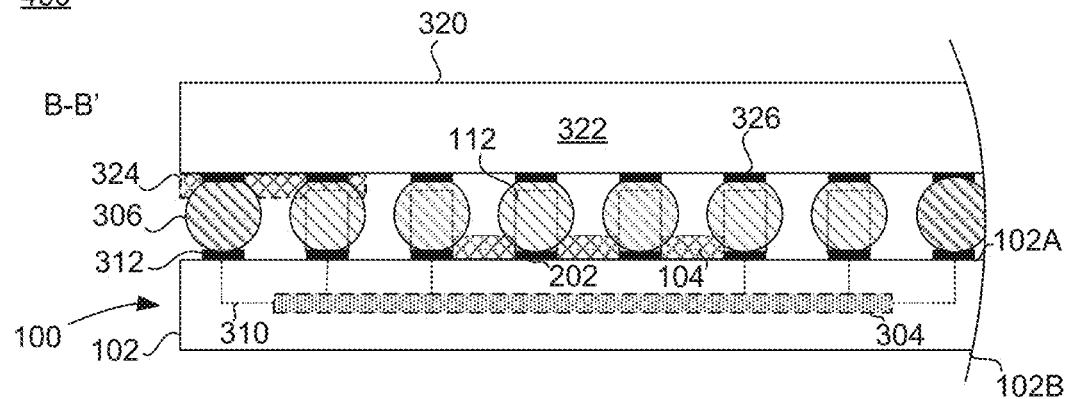

FIGS. 4A and 4B are exploded and cross-sectional views of another flip-chip semiconductor system 400, in accordance with some embodiments. The flip-chip semiconductor system 400 includes a semiconductor chip 100 and another substrate 322 that is coupled onto the semiconductor chip 100. Specifically, the semiconductor system 400 includes a semiconductor substrate 102, a heat generating circuit 104, a first plurality of pillars 108A, one or more additional pillars 112, a plurality of contact pads 202, a ground 304, a plurality of electrodes 306, and an external semiconductor device 320. In some embodiments, the external semiconductor device 320 includes another substrate 322, one or more additional circuits 324, and another plurality of contact pads 326. Both of the exploded and cross-sectional views in FIGS. 4A and 4B correspond to an instance of the flip-chip semiconductor system 400 that is cut along a line B-B' of the semiconductor chip 100 in FIGS. 1A and 1B.

The semiconductor substrate 102 includes one or more circuits (e.g., the heat generating circuit 104) formed on a first surface 102A of the semiconductor substrate 102. In some embodiments, the semiconductor substrate 102 includes a plurality of contact pads 202 formed on the first surface 102A. In some embodiments, the plurality of contact pads 202 is coupled between the first surface 102A of the semiconductor substrate 102 and the first plurality of pillars 108A. In some embodiments, the one or more additional pillars 112 are formed on the one or more circuits of the semiconductor substrate 102, e.g., on contact pads 202 formed on the heat generating circuit 104.

The plurality of electrodes 306 is disposed between the semiconductor chip 100 and the external semiconductor device 320. The plurality of electrodes 306 is configured to couple one or more circuits (e.g., the heat generating circuit 104, the heat sensitive circuit 106, and/or other circuits) of the semiconductor chip 100 and one or more circuits (e.g., additional circuits 324) of the external semiconductor device 320. The plurality of electrodes 306 have a predefined electrode height $h_E$ that is greater than the heights $h_P$ of the pillars 108, 110 and 112. Note that the pillars 110 are not shown in FIGS. 4A and 4B (additional details on pillars 110 are provided above in FIGS. 1A-2B). More details on the heights of the electrodes 306 and pillars 108-112 are discussed above with reference to FIGS. 3A and 3B.

In some embodiments, each of the contact pads 202 formed on the first surface 102A is open, receives a pillar 108, 110 or 112, or receives an electrode 306. In some embodiments, none of the contact pads 202 formed on the first surface 102A receives both a pillar 108, 110 or 112 and an electrode 306. Conversely, in some embodiments, one of the contact pads 202 is enlarged to receive both a pillar 108, 110 or 112 and an electrode 306.

Figure 5A:
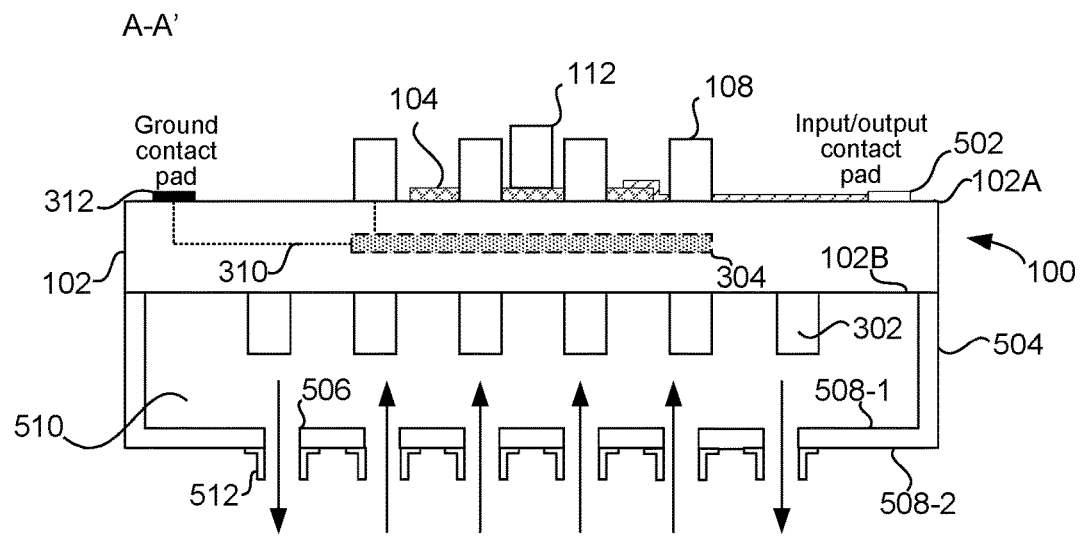
FIG. 5A is a cross sectional view of a semiconductor system having a cooling cavity, in accordance with some embodiments.
Figure 5B:
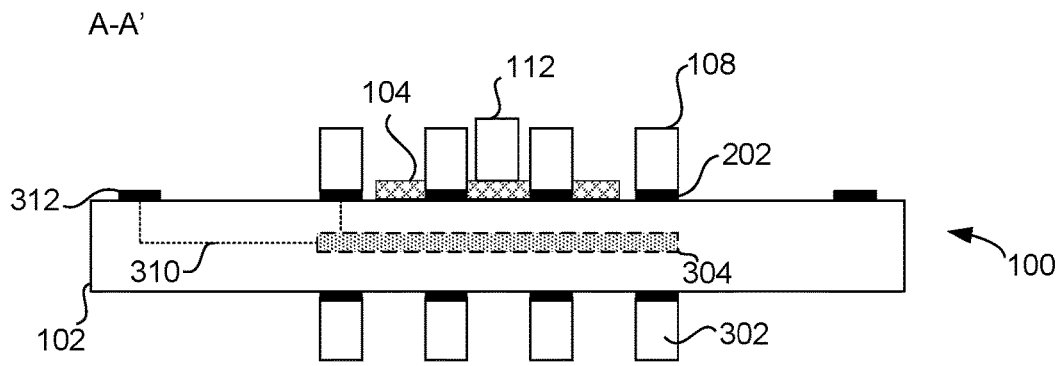
FIG. 5B is a cross sectional view of an integrated semiconductor chip in which one or more pillars are formed on contact pads, in accordance with some embodiments.

FIG. 5A is a cross sectional view of a second semiconductor chip 500 having a cooling cavity, in accordance with some embodiments, and FIG. 5B is a cross sectional view of a third (integrated) semiconductor chip 550 that includes one or more pillars formed on contact pads, in accordance with some embodiments. Both of the second semiconductor chip 500 and the third (integrated) semiconductor chip 550 correspond to instances of the semiconductor 100 that is cut along a line A-A' as shown in FIGS. 1A and 1B. The semiconductor system 500 includes a semiconductor substrate 102, a heat generating circuit 104, a first plurality of pillars 108A, one or more additional pillars 112, a third plurality of pillars 302, a plurality of contact pads 202, a ground 304, and a cooling substrate 504.

In some embodiments, the plurality of contact pads 202 is formed on one or more surfaces 102A and/or 102B of the semiconductor substrate 102. The plurality of contact pads 202 includes one or more of: ground contact pads 312 coupled to the ground 304 of the semiconductor chip 100 and input/output contact pads 502 for communicating signals internally within or externally with other semiconductor device(s). In some embodiments, the one or more ground contact pads 312 are coupled to the ground 304 via one or more ground vias 310. In some embodiments, a subset of the input/output contact pads 502 is configured to receive input signals from the one or more circuits of the semiconductor chip 100 (e.g., the heat generating circuit 104, the heat sensitive circuit 106, and/or other circuits of the semiconductor chip 100), external semiconductor systems 320 (FIGS. 3A-4B), user input devices, and/or other components external to the semiconductor chip 100; and provide the input signals to the semiconductor chip 100. In some embodiments, a subset of the input/output contact pads 502 is configured to receive output signals from one or more circuits or components of the semiconductor chip 100 and provide the output signals to other circuits of the semiconductor chip 100, external semiconductor systems, user input devices, and/or other components external to the semiconductor chip 100.

Referring to FIG. 5A, in some embodiments, each pillar 108, 112 or 302 in a subset of pillars is formed on a respective area of the substrate 102, and the respective area is optionally covered by one or more material layers, but not by any contact pad 202. Referring to FIG. 5B, in some embodiments, each pillar 108, 112 or 302 in a subset of pillars is formed on a contact pad 202 that is optionally a ground contact pad 312, an input/output contact pad 502, or a dummy contact pad 202 not electrically coupled to any circuit node. The plurality of pillars 108 is disposed on both of the surfaces 102A and 102B, and the one or more additional pillars 112 are disposed on the one or more circuits of the semiconductor chip 100. These pillars 108 and 112 increase the overall surface area of the semiconductor chip 100 and improve heat transfer and dissipation of the second semiconductor chip 500, particularly when a coolant flows over one or both surfaces of the semiconductor chip 100.

The cooling substrate 504 is physically coupled to the semiconductor substrate 102, and includes a third surface 508-1 and a fourth surface 508-2 opposite the third surface 508-1. The third surface 508-1 faces (or is adjacent to) the second surface 102B of the semiconductor substrate 102. The third surface 508-1 of the cooling substrate 504 and the second surface 102B of the semiconductor substrate 102 are separated by a predefined distance and define a cooling cavity 510. In some embodiments, the predefined distance is between 100 nm and 0.5 mm.

The cooling substrate 504 includes the plurality of via openings 506 between the third surface 508-1 and the fourth surface 508-2. The plurality of via openings 506 has a predefined size. In some embodiments, the predefined size of the plurality of via openings 506 is a diameter between 50 to 100 micrometers inclusive. In some embodiments, each via opening 506 has the same predefined size. Alternatively, in some embodiments, at least one via opening 506 has a predefined size that is distinct from those of other via openings 506. A coolant (e.g., air, water, etc.) enters the cooling cavity 510 via a subset of via openings 506 and flows between the cooling substrate 504 and the semiconductor substrate 102. In some embodiments, the plurality of via openings 506 is coupled to one or more nozzles 512 that are configured to inject the coolant through the subset of via openings 506.

The cooling cavity 510 has a cavity height defined by a distance between the second surface 102B of the semiconductor substrate 102 and the third surface 508-1 of the cooling substrate 504. In some embodiments, the cavity height of the cooling cavity 510 is between 100 nm to 0.5 mm. In some embodiments, the cavity height of the cooling cavity 510 is at least 100 microns. The cooling cavity 510 is fully sealed except the plurality of via openings 506, thereby forcing the coolant to enter and exit the cooling cavity 510 only through the plurality of via openings 506 of the cooling substrate 504. Examples of the coolant include air, water, refrigerants, or other fluids and/or gasses.

The coolant flowing through the plurality of via openings 506 of the cooling substrate 504 impinges on the second surface 102B of the semiconductor substrate 102 and cools down the semiconductor substrate 102 (and/or one or more circuits of the semiconductor substrate 102). Specifically, the coolant flowing through the plurality of via openings 506 of the cooling substrate 504 improves heat transfer of the semiconductor substrate 102 by reducing a substrate temperature and/or allowing the substrate 102 to cool the one or more circuits formed on the substrate 102. In some embodiments, the second surface 102B is coupled to the third plurality of pillars 302 that increases a surface area of the substrate 102 and improves heat dissipation via the substrate 102. In some situations, application of the pillars 302 on the second surface 102B of the substrate provides a greater flexibility in this cooling process by sparing a requirement to focus impingement cooling at a specific location of the substrate 102.

It is noted that first part of heat generated by the semiconductor chip 100 is dissipated to air directly from a circuit area or indirectly via an increases area of the pillars 108 coupled to the first surface 102A of the substrate. The semiconductor substrate 102 is configured to absorb second part of heat generated by the semiconductor chip 100 (e.g., the heat generating circuit 104, heat sensitive circuit 106, and/or other circuits) and spread the second part of the heat from the first surface 102A to the second surface 102B. The heat spread to the second surface 102B is carried away by the coolant, as the coolant flows in the cooling cavity 510 and exit the cooling cavity 510 via the plurality of via openings 506 and/or one or more nozzles 512. By these means, the semiconductor substrate 102 cools the one or more circuits by creating an efficient heat dissipation path through a rear surface (i.e., the second surface 102B) of the semiconductor chip 100, while maintaining heat dissipation from a front surface (i.e., the first surface 102A) of the semiconductor chip 100.

In some embodiments, heat dissipation of the semiconductor substrate 102 is based, in part, on a size and/or shape (e.g., circular, cross, etc.) of the openings of the plurality of via openings 506 and/or the one or more nozzles 512, a distance to diameter ratio (z/d; e.g., L_s/predefined size of the plurality of via openings 506), an impingement angle, Reynolds number, the number of plurality of via openings 506 and/or nozzles 512, a separation between the plurality of via openings 506 and/or nozzles 512, a coolant flow rate, a type of coolant, a coolant temperature, and/or other factors known in the art. Although the cooling substrate 504 is coupled to the second surface 102B, the skilled artisan in this field will appreciate upon reading this disclosure that the cooling substrate 504, the plurality of via openings 506, the cooling cavity 510 and/or other components of the additional cooling structure can be coupled to the first surface 102A of the semiconductor substrate 102.

It is noted that FIGS. 5A and 5B are non-limiting examples of cooling techniques (e.g., applications of pillars and impingement coolants) that can be used jointly for the semiconductor chip 100. The pillars 108, 112 and 302 can be applied jointly with other cooling techniques to improve heat dissipation of the semiconductor chip 100.

Figure 6A:
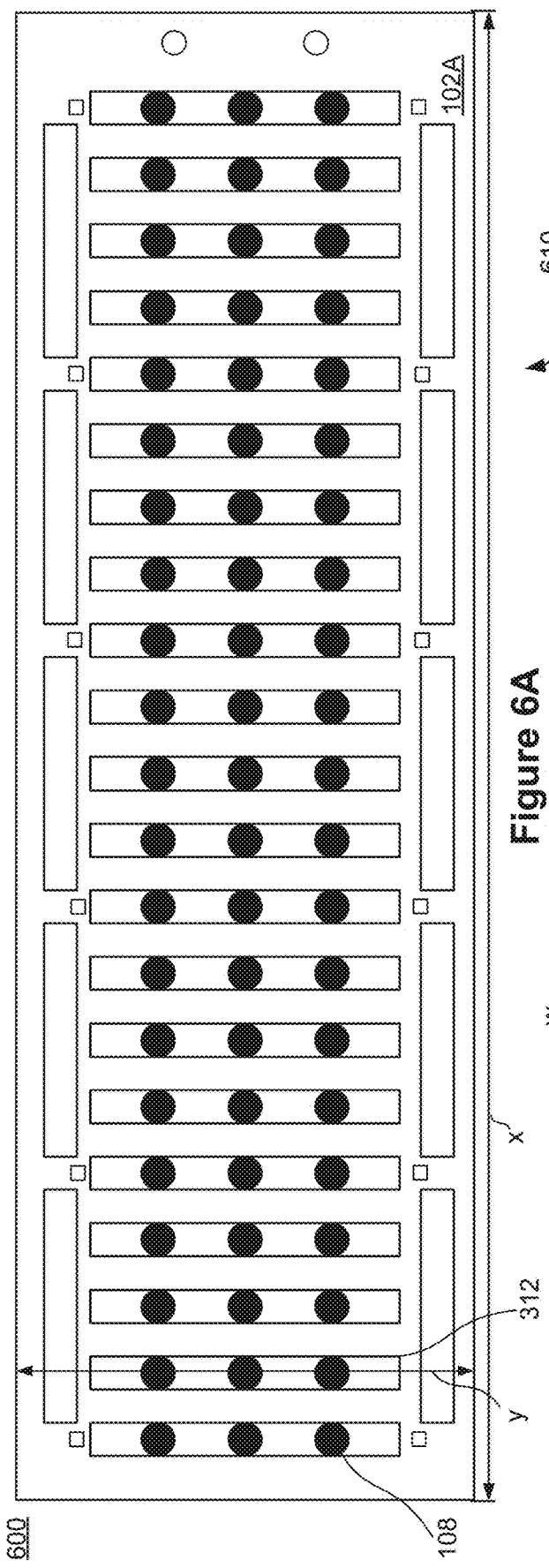
FIGS. 6A and 6B illustrate a top view and a cross sectional view of a semiconductor chip where pillars are formed on ground pads, in accordance with some embodiments, respectively.
Figure 6B:
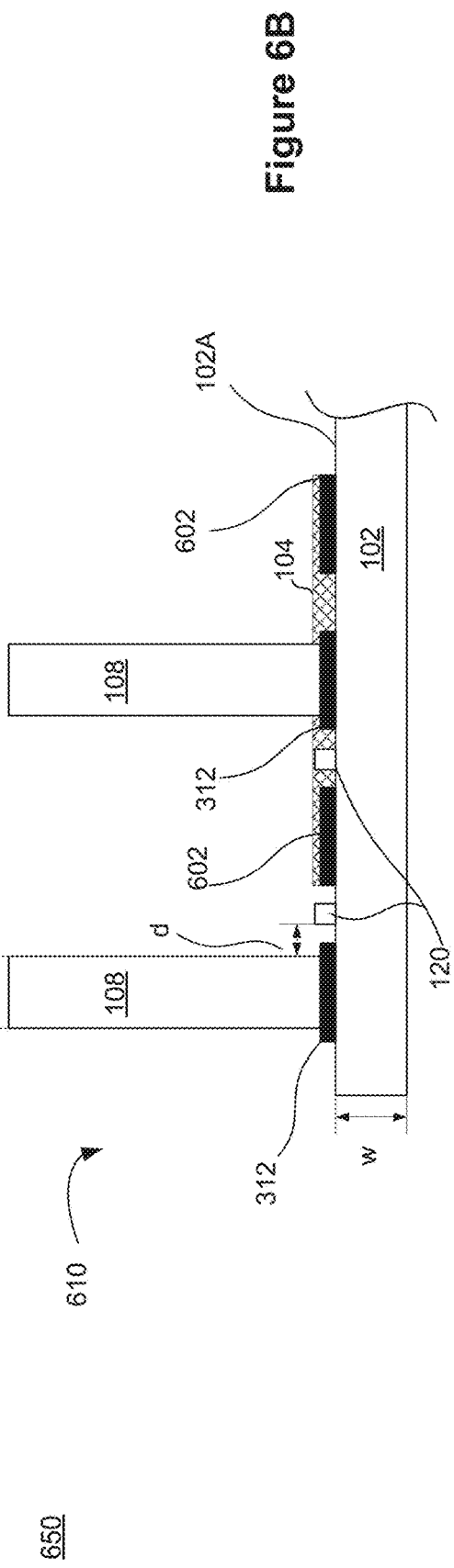

FIGS. 6A and 6B illustrate a top view 600 and a cross sectional view 650 of a semiconductor chip 610 where pillars are formed on grounded pads 312, in accordance with some embodiments, respectively. In some embodiments, the semiconductor chip 610 is an instance of the any of the semiconductor chips described above in reference to FIGS. 1A-5B. The top view 600 of the semiconductor chip 610 includes a first surface 102A of the semiconductor substrate 102, a plurality of pillars 108, and a plurality of ground pads 312.

The semiconductor substrate 102 has a length has a length along an x-axis and a width along a y-axis. In some embodiments, the plurality of ground pads 312 are formed in one or more rows extending along the width (y) of the semiconductor substrate 102. In an example (FIG. 6A), the ground pads 312 are arranged into a plurality of rows, and each row includes a single ground pad 312 having an extended length. In another example not shown in FIG. 6A, each row includes more than one ground pad 312. Each row optionally covers a portion or an entirety of the width (y) of the semiconductor substrate 102, independently of a first number of ground pads 312 are included in the respective row. The plurality of ground pads 312 includes a second number of rows that are distributed across a portion or an entirety of the length (x) of the semiconductor substrate. Additionally, the plurality of pillars 108 are formed on top of the plurality of ground pads 312. One or more pillars 108 are formed on each row of at least a subset of the plurality of ground pads 312. For example, as shown in the top view 600, at least three pillars are formed on each ground pad row 312, which includes only one ground pad having an extended length in this example.

In some embodiments, the semiconductor chip 610 includes one or more of heat generating circuits 104 and heat sensitive circuits 106, and the heat generating circuits 104 include transistors 120 having gate fingers. In some embodiments not shown in FIGS. 6A and 6B, the plurality of pillars 108 include one or more pillar walls 110 and additional pillars 112 formed on top of the one or more heat generating circuits 104 and/or heat sensitive circuits 106, respectively. Additionally, in some situations, the semiconductor chip 610 is further configured to transfer heat dissipated by the one or more heat generating circuits 104 (particularly, transistors 120) using coolant flowing over the plurality of pillars 108. The flow of the coolant is optionally parallel to the substrate 102 or perpendicular to the substrate 102.

The cross-sectional view 650 of the semiconductor chip 610 includes first surface 102A of the semiconductor substrate 102, the plurality of pillars 108, the plurality of ground pads 312, and a heat generating circuit 104 including a plurality of transistors 120. The plurality of pillars 108 are formed on top on the plurality of ground pads 312. In some embodiments, a subset of the plurality of pillars 108 are substantially adjacent to each transistor 120 (e.g., no more than a few microns (e.g., less than 10 microns represented by distance d)). In some embodiments, the width (w) of the plurality of pillars 108 is comparable to the thickness of the semiconductor substrate 102, e.g., in the same order of magnitude. For example, the width (w) of the plurality of pillars 108 is approximately 100 microns (e.g., +/−10 microns), and the thickness of the semiconductor substrate 102 is approximately 500 microns. In some embodiments, the plurality of pillars 108 have an aspect ratio of at least 10, i.e., a ratio between a height and width of the pillars 108 is equal to 10 or above. For example, a pillar 108 has a width of approximately 100 microns and a height more than 1 mm.

Referring to FIG. 6B, every two adjacent ground pad rows are separated by another intermediate pad 602. Each intermediate pad 602 corresponds to a single pad or a row of pads. Each pad is optionally a ground pad configured to electrically couple to ground or a signal pad configured to electrically transfer a circuit signal. No pillar 108 is disposed directly on top of the intermediate pad 602. Conversely, in some embodiments as shown in FIG. 7B, a pillar 108 is disposed on top of the intermediate pad 602, and however, physically separated from the intermediate pad 602 by at least a metal bridge 725.

Figure 7A:
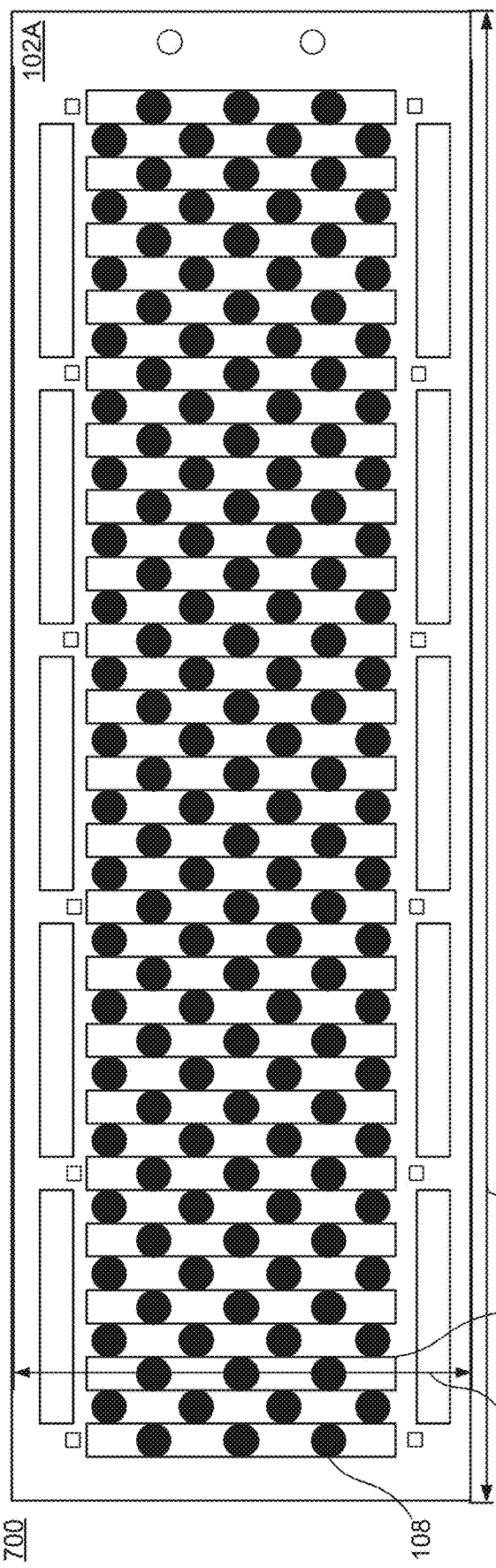
FIGS. 7A and 7B illustrate a top view and a cross sectional view of another semiconductor chip where pillars are formed on ground pads and bridges, in accordance with some embodiments, respectively.
Figure 7B:
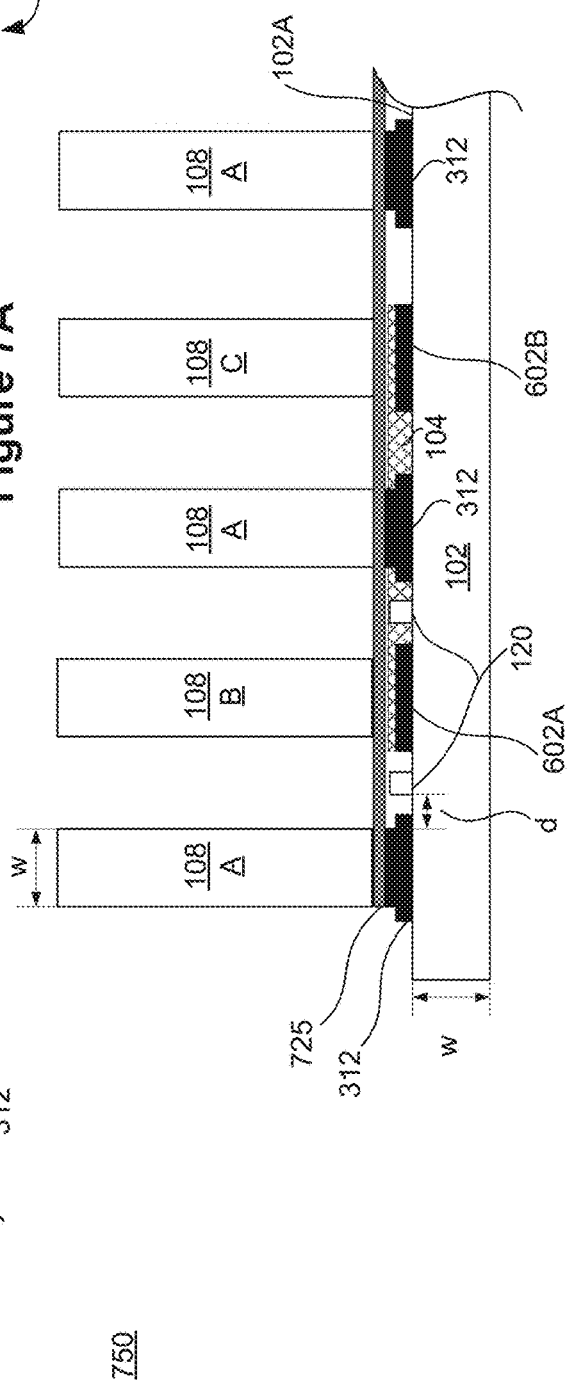

FIGS. 7A and 7B illustrate a top view 700 and a side view 750 of a semiconductor chip 710 where pillars are formed on both ground pads 312 and metal bridges 725, in accordance with some embodiments, respectively. In some embodiments, the semiconductor chip 710 is an instance of the any of the semiconductor chips described above in reference to FIGS. 1A-5B. The top view of the semiconductor chip 710 includes a first surface 102A of the semiconductor substrate 102, a plurality of pillars 108, plurality of ground pads 312, and one or more metal bridges 725.

In some embodiments, the plurality of ground pads 312 are formed in one or more rows. For example, in FIG. 7A, each row includes a single ground pad 312 having an extended length. In another example not shown, each row includes plurality of ground pads 312. In some embodiments, the one or more metal bridges 725 are coupled between at least two rows of ground pads 312. More specifically, the one or more metal bridges 725 are coupled between plurality of ground pads 312 and the plurality of pillars 108. The one or more metal bridges 725 extend across a portion of the width (y) of the semiconductor substrate 102. In some embodiments, the one or more metal bridges 725 extend across a portion of the length (x) of the semiconductor substrate 102. In some embodiments, each of a plurality of parallel metal bridges 725 extends along a respective portion of the length (x) of the semiconductor substrate 102, and is distributed at a distinct location at the width (y) of the semiconductor substrate 102. Alternatively, in some embodiments, a single metal bridge 725 extends along a portion of the length (x) of the semiconductor substrate 102, and covers a portion of the width (y) of the semiconductor substrate 102. In some embodiments, the plurality of pillars 108 are formed on top of the one or more metal bridges 725 between two adjacent rows of ground pads 312. For example, as shown in top view 700, at least four pillars are formed between two adjacent rows of ground pads 312 (that include three pillars 108).

Referring to FIG. 7B, the one or more metal bridges 725 are coupled between plurality of ground pads 312 and a first subset of the plurality of pillars 108A, while the first subset of pillars 108A are disposed directly on top of the plurality of ground pads 312. In some embodiments not shown in FIG. 3B, a second subset of the plurality of pillars 108 are formed over the one or more metal bridges 725, and situated directly over the transistors 120 that are within or external to the heat generating circuit 104 without directly contacting any portion of the transistors 120. Additionally, in some embodiments, the first surface 102A further includes one or more intermediate pads 602 that are adjacent to the ground pads 312, such that the one or more metal bridges 725 connecting the ground pads 312 pass the one or more intermediate pads 602 from the top. Optionally, such an intermediate pad 602A is electrically coupled to a circuit signal, and is electrically insulated from the one or more metal bridges 725 by a dielectric material. A pillar 108B is formed directly on the one or more metal bridges 725 at a location overlapping the intermediate pad 602A, and however, the pillar 108B is electrically isolated from the intermediate pad 602A by the dielectric material. Optionally, such an intermediate pad 602B is electrically coupled to the ground to which the ground pads are electrically coupled, but is still electrically insulated from the one or more metal bridges 725 passing over the top by a dielectric material. In some situations, a pillar 108C is formed directly on the one or more metal bridges 725 at a location overlapping the intermediate pad 602B, and however, the pillar 108C is electrically isolated from the intermediate pad 602B by the dielectric material.

FIGS. 8A and 8B are cross sectional views of the above two semiconductor chips 610 and 710 that are cooled by an impingement cooling process, in accordance with some embodiments, respectively. Each of the semiconductor chips 610 and 710 including a first surface 102A of the semiconductor substrate 102 along with a heat generating side and a heat sensitive side, a plurality of pillars 108, one or more pillar walls 110, a plurality of ground pads 312, one or more transistors 120, and a heat generating circuit 104. The semiconductor chip 710 further includes one or more metal bridges 725. Coolant is injected onto the first surface 102A of the semiconductor substrate 102. The coolant flows over the first surface 102A of the semiconductor substrate 102 and exits either the first exit or the second exit. The pillar wall 110 (also referred to as an airflow barrier) is configured such that high temperature coolant flows over the heat generating side of the semiconductor substrate 102 and leaves the system via the first exit. More specifically, the pillar wall 110 prevents high temperature coolant from flowing over the heat sensitive side of the semiconductor substrate 102. For purposes of this disclosure, high temperature coolant is coolant that has been heated by one or more of the heat generating circuits 104 and/or transistors 120. Similarly, the pillar wall 110 is configured such that low temperature coolant (i.e., coolant that has not been heated by the heat generating circuits 104 and/or transistors 120) flows over the heat sensitive side of the semiconductor substrate 102 and leaves the system via the second exit.

In some embodiments, the width (w) of the plurality of pillars 108 is comparable to the thickness of the semiconductor substrate 102, e.g., in the same order of magnitude. In some embodiments, the width of the pillar wall is equal to or greater than the width (w) of the plurality of pillars 108 and the thickness of the semiconductor substrate 102. In some embodiment, the pillar walls 110 have the same height or greater height than the plurality of pillars 108. The different heights of the plurality of pillars 108 and the pillar walls are discussed above in reference to FIGS. 2A-3B.

FIG. 8C is a cross sectional view of another example semiconductor chip 800, in accordance with some embodiments. The semiconductor chip 800 includes a semiconductor substrate 102 having a surface 102A, a circuit 104 formed on the surface 102A, and a plurality of pillars 108 coupled to the surface 102A adjacent to the circuit 104. The plurality of pillars 108 is thermally conductive and is thermally coupled to the circuit so as to dissipate heat generated by the circuit during use. The semiconductor substrate 102, circuit 104, and plurality of pillars 108 are integral parts of the integrated semiconductor chip. In an example, the plurality of pillars 108 includes a pillar wall 110 that has a length greater than a width. The pillar wall 110 is disposed adjacent to the heat generating circuit 10, and configured to at least partially block the coolant (e.g., air flow) carrying the heat generated by the heat generating circuit 104 and reduce its thermal impact on another area of the semiconductor chip 800.

Additionally, the semiconductor chip 800 includes a flat structure 802. The flat structure 802 is mechanically coupled to a subset of the plurality of pillars 108, and extends along a structure surface that is parallel to the surface 102A of the semiconductor substrate 102. The flat structure 802 is at least supported by two pillars 108 and floats above a pressure sensitive area 804, such that an air flow does not directly hit on the area 804. In an example, the pressure sensitive area 804 includes a piezoelectric or piezoresistive unit. In another example, the pressure sensitive area 804 includes a wire bonding structure 804A. The flat structure 802 floats above a wire bonding structure 804A, and is configured to protect the wire bonding structure 804 from topside air cooling. In some embodiments, the flat structure 802 is made of a thermally conductive material that is configured to exchange heat with the pillars 108 and the air flow, such that the heat generated by any circuit covered by the flat structure 802 can still be carried away by the pillars 108 and flat structure 802 efficiently.

In some embodiments, the semiconductor chip 800 includes a plurality of separate flat structures 802. Each of a subset of flat structure 802 is associated with one or more respective pressure sensitive areas 804, and has a respective shape configured according to the one or more respective pressure sensitive areas 804. Each flat structure 802 is mechanically supported by a respective subset of pillars 108.

In some embodiments, a sacrificial layer is deposited on the surface 102A of the semiconductor substrate 102, and a structure layer is formed on top of the sacrificial layer. The structure layer is patterned to one or more flat structures 802. The one or more flat structures 802 float above the surface 102A of the semiconductor substrate 102 after the sacrificial layer is removed. For example, the sacrificial layer is made of photoresist, and the flat structures 802 are made of copper or gold.

Figure 9:
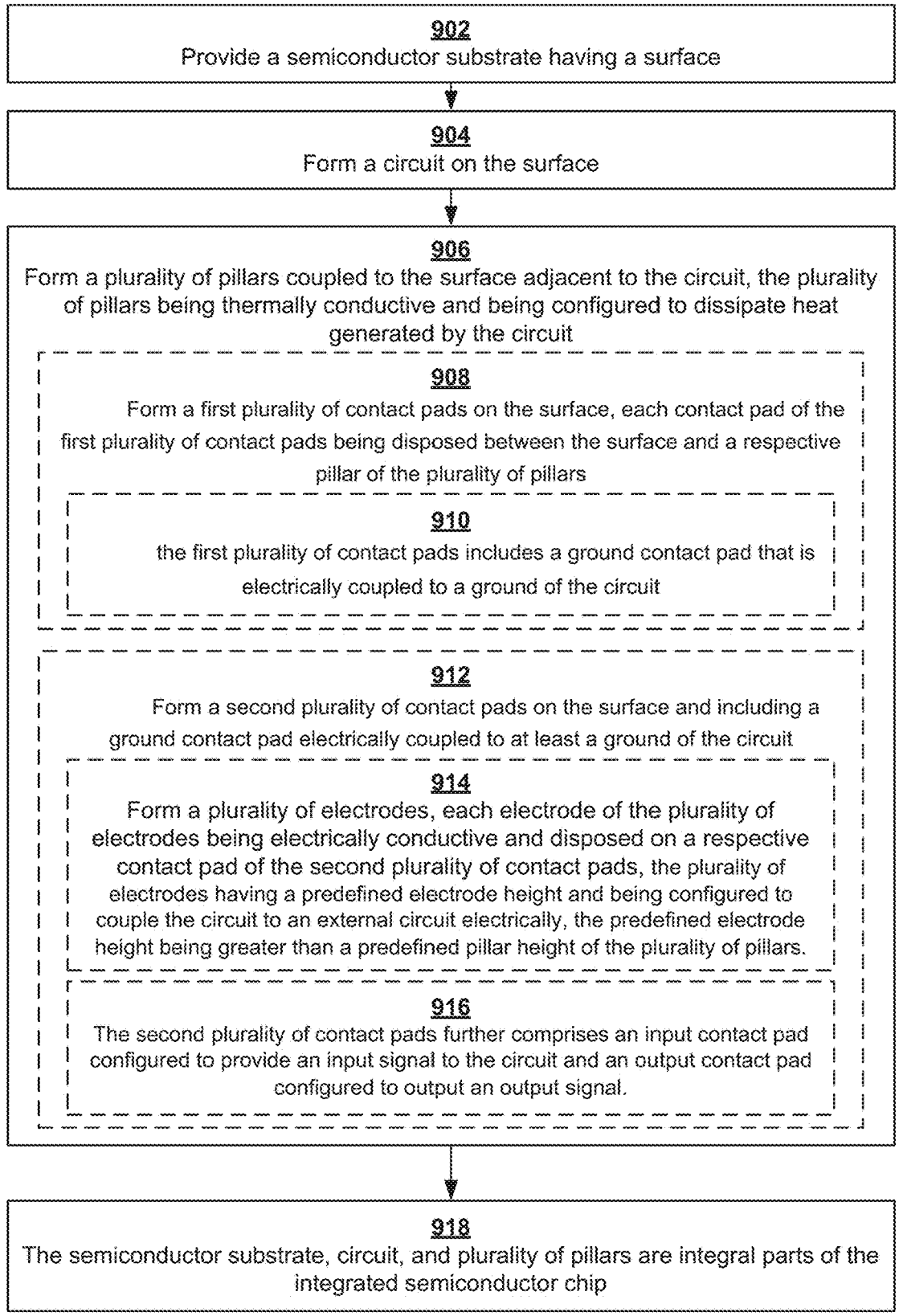
FIG. 9 is a flowchart of a method of forming the semiconductor system, in accordance with some embodiments.

FIG. 9 is a flowchart of a method 900 of forming a semiconductor system, in accordance with some embodiments. The method 900 includes providing (902) a semiconductor substrate 102 having a surface (e.g., a first surface 102A). The fabrication method 900 further includes forming (904) a circuit (e.g., a heat generating circuit 104) on the surface and forming (906) a plurality of pillars 108 coupled to the surface adjacent to the circuit. The plurality of pillars 108 is thermally conductive and is thermally coupled to the circuit so as to dissipate heat generated by the circuit. In some embodiments, forming the plurality of pillars 108 includes electroplating copper or other thermally conductive material on the surface of the semiconductor substrate 102. Alternatively, in some embodiments, forming the plurality of pillars 108 includes printing copper or other thermally conductive material on the surface of the semiconductor substrate 102. As such, in some embodiments, the circuit is formed using semiconductor fabrication techniques, and formation of the pillars is compatible with the fabrication of the circuit.

In some embodiments, the method 900 includes forming (908) a first plurality of contact pads 202 on the surface. Each contact pad 202 of the first plurality of contact pads is disposed between the surface 102A and a respective pillar of the plurality of pillars 108. In some embodiments, the first plurality of contact pads 202 includes (910) a ground contact pad 312 that is electrically coupled to a ground of the circuit. Stated another way, a pillar of the plurality of pillars 108 is formed on the ground contact pad 312 that is coupled to the ground 304.

Referring to FIGS. 7A and 7B, in some embodiments, an intermediate pad 602A is disposed between two of the first plurality of contact pads 312. The two of the first plurality of contact pads 312 are physically and electrically coupled to one another via a metal bridge 725 that is disposed over the intermediate pad 602A, and the metal bridge 725 is electrically isolated from the intermediate pad 602A. Further, in some embodiments, the first plurality of pillars further includes a respective pillar 108B disposed directly on top of the intermediate pad 602A, and the respective pillar 108B is situated on the metal bridge 725. Additionally, in some embodiments, the two of the first plurality of contact pads 312 are electrically coupled to the ground of the circuit, and the intermediate pad 602A is coupled to a circuit signal distinct from the ground.

In some embodiments, the method 900 includes forming (912) a second plurality of contact pads on the surface and including a ground contact pad 312 that is coupled to the ground 304 of the circuit. The second plurality of contact pads is not located under any pillars. Further, in some embodiments, the fabrication method 900 includes forming (914) a plurality of electrodes 306. Each electrode of the plurality of electrodes 306 is electrically conductive and disposed on a respective contact pad 202 of the second plurality of contact pads. The plurality of electrodes has a predefined electrode height $h_E$ and is configured to couple the circuit to an external circuit electrically. The predefined electrode height $h_E$ is greater than a predefined pillar height $h_P$ of the plurality of pillars 108. For example, referring to FIGS. 3A and 3B, the plurality of electrodes 306 s configured to be larger than the plurality of pillars 108 and/or the one or more additional pillars 112. As further shown in FIGS. 3A-4B, each of the plurality of electrodes 306 is disposed between the contact pads 202 and 326 (e.g., one or more contact pads that do not have pillars formed on them). In some embodiments, the method 900 includes providing a second substrate 322 that is flip-chip coupled to the substrate 102 via the plurality of electrodes 306 (as described above in reference to FIGS. 3A-4B). In some embodiments, the second plurality of contact pads further includes (916) an input contact pad configured to provide an input signal to the circuit of the semiconductor chip 100 and an output contact pad configured to output an output signal from the semiconductor chip 100.

The semiconductor substrate, circuit, and plurality of pillars are (918) integral parts of the integrated semiconductor chip (i.e., the semiconductor chip 100).

The terminology used in the description of the invention herein is for the purpose of describing particular embodiments only and is not intended to be limiting of the invention. As used in the description of the invention and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

It will also be understood that, although the terms "first," "second," etc. may be used herein to describe various elements, these elements should not be limited by these terms. These terms are only used to distinguish one element from another. For example, a first region could be termed a second region, and, similarly, a second region could be termed a first region, without changing the meaning of the description, so long as all occurrences of the "first region" are renamed consistently and all occurrences of the "second region" are renamed consistently. The first region and the second region are both regions, but they are not the same region.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. An integrated semiconductor chip, comprising:
a semiconductor substrate having a surface;
a first circuit integrated at least partially into a first circuit area of the surface;
a plurality of pillars integrally coupled onto the surface, the plurality of pillars being adjacent to and at least partially surrounding, the first circuit area of the surface, wherein the plurality of pillars are thermally conductive and are thermally coupled to the first circuit so as to dissipate heat generated by the first circuit during use;
a second circuit integrated at least partially into a second circuit area of the surface; and
a pillar wall integrally coupled onto the surface between the first circuit area and the second circuit area, wherein the pillar wall has a length greater than a length of the second circuit to at least partially block air flow that carries the heat generated by the first circuit during use;
wherein the semiconductor substrate, the first circuit, and the plurality of pillars are integral parts of the integrated semiconductor chip.

2. The integrated semiconductor chip of claim 1, further comprising:
one or more additional pillars formed on top of the first circuit for dissipating the heat generated by the first circuit.

3. The integrated semiconductor chip of claim 1, further comprising:
a first plurality of contact pads formed on the surface, wherein each contact pad of the first plurality of contact pads is disposed between the surface and a respective pillar of the plurality of pillars.

4. The integrated semiconductor chip of claim 3, wherein the first plurality of contact pads include a ground contact pad that is electrically coupled to a ground of the first circuit.

5. The integrated semiconductor chip of claim 3, further comprising:
an intermediate pad disposed between two of the first plurality of contact pads, wherein the two of the first plurality of contact pads are physically and electrically coupled to one another via a metal bridge that is disposed over the intermediate pad, and the metal bridge is electrically isolated from the intermediate pad.

6. The integrated semiconductor chip of claim 5, wherein the plurality of pillars further includes a respective pillar disposed directly on top of the intermediate pad, and the respective pillar is situated on the metal bridge.

7. The integrated semiconductor chip of claim 5, wherein the two of the plurality of contact pads are electrically coupled to a ground of the first circuit, and the intermediate pad is coupled to a circuit signal distinct from the ground.

8. The integrated semiconductor chip of claim 1, further comprising:
a second plurality of contact pads formed on the surface and including a ground contact pad electrically coupled to a ground of the first circuit.

9. The integrated semiconductor chip of claim 8, further comprising:
a plurality of electrodes, each electrode of the plurality of electrodes being electrically conductive and disposed on a respective contact pad of the second plurality of contact pads;
wherein the plurality of electrodes have a predefined electrode height and is configured to electrically couple the first circuit to an external circuit, the predefined electrode height being greater than a predefined pillar height of the plurality of pillars.

10. The integrated semiconductor chip of claim 9, wherein the semiconductor substrate includes a first substrate and a second substrate, wherein the second substrate is flip-chip coupled to the first substrate via the plurality of electrodes.

11. The integrated semiconductor chip of claim 8, wherein the second plurality of contact pads further comprise an input contact pad configured to provide an input signal to the first circuit and an output contact pad configured to output an output signal of the first circuit.

12. The integrated semiconductor chip of claim 1, wherein each pillar of the plurality of pillars has a respective aspect ratio that is equal to or greater than 10.

13. The integrated semiconductor chip of claim 1, wherein the plurality of pillars include a first plurality of pillars, and the integrated semiconductor chip further comprises:
a second plurality of pillars coupled to the surface adjacent to the second circuit, wherein the second plurality of pillars are thermally conductive and thermally coupled to the second circuit so as to at least partially absorb and dissipate the heat generated by the first circuit and protect the second circuit from the heat generated by the first circuit.

14. The integrated semiconductor chip of claim 13, wherein the second plurality of pillars include the pillar wall.

15. The integrated semiconductor chip of claim 1, wherein the surface includes a first surface, and the plurality of pillars include a first plurality of pillars, and the integrated semiconductor chip further comprises:
a third plurality of pillars formed on a second surface of the semiconductor substrate, the second surface opposite the first surface.

16. The integrated semiconductor chip of claim 1, wherein the plurality of pillars are made of copper.

17. The integrated semiconductor chip of claim 1, wherein the plurality of pillars coupled to the surface adjacent to and at least partially surrounding the first circuit comprises one or more pillars at one or more sides of the first circuit.

18. A method, comprising:
providing a semiconductor substrate having a surface;
integrating a first circuit at least partially into a first circuit area of the surface; and
integrating a plurality of pillars onto the surface, the plurality of pillars being adjacent to and at least partially surrounding the first circuit area of the surface, wherein the plurality of pillars are thermally conductive and thermally coupled to the first circuit so as to dissipate heat generated by the first circuit during use;
integrating a second circuit integrated at least partially into a second circuit area of the surface; and
providing a pillar wall integrally coupled onto the surface between the first circuit area and the second circuit area, wherein the pillar wall has a length greater than a length of the second circuit to at least partially block air flow that carries the heat generated by the first circuit;
wherein the semiconductor substrate, the first circuit, and the plurality of pillars are integral parts of an integrated semiconductor chip.

19. The method of claim 18, wherein the plurality of pillars include a first plurality of pillars, the method further comprising:
providing a second plurality of pillars integrally coupled onto the surface, the second plurality of pillars being adjacent, and at least partially surrounding, the second circuit area of the surface, wherein the second plurality of pillars are configured to direct a coolant flow carrying the heat generated by the first circuit away from the second circuit.

20. The method of claim 18, wherein integrating the first circuit on the surface further comprises:
applying semiconductor fabrication techniques to monolithically integrate an integrated circuit at least partially into the first circuit area of the surface of the semiconductor substrate.

* * * * *